(12) United States Patent
Slutz et al.

(10) Patent No.: US 7,367,875 B2
(45) Date of Patent: May 6, 2008

(54) CVD DIAMOND-COATED COMPOSITE SUBSTRATE CONTAINING A CARBIDE-FORMING MATERIAL AND CERAMIC PHASES AND METHOD FOR MAKING SAME

(75) Inventors: David E. Slutz, Bethlehem, PA (US); Steven J. Finke, Kutztown, PA (US)

(73) Assignee: Morgan Advanced Ceramics, Inc., Hayward, CA (US)

( * ) Notice: Subject to any disclaimer, the term of this patent is extended or adjusted under 35 U.S.C. 154(b) by 0 days.

(21) Appl. No.: 11/165,873

(22) Filed: Jun. 24, 2005

(65) Prior Publication Data

US 2005/0276979 A1 Dec. 15, 2005

Related U.S. Application Data

(62) Division of application No. 10/627,931, filed on Jul. 25, 2003, now abandoned.

(51) Int. Cl.
*B24B 21/18* (2006.01)

(52) U.S. Cl. .................... 451/443; 451/56; 427/249.8; 428/408

(58) Field of Classification Search .................. 451/56, 451/443, 285, 287; 427/249.8, 249.11, 249.12, 427/255.7, 122; 428/408, 469, 472, 698
See application file for complete search history.

(56) References Cited

U.S. PATENT DOCUMENTS

| | | | |
|---|---|---|---|
| 2,201,195 A | 5/1940 | Melton et al. | |
| 2,277,520 A | 3/1942 | Martin et al. | |
| 3,334,041 A | 8/1967 | Dyer et al. | |
| 4,486,200 A | 12/1984 | Heyer et al. | |
| 4,576,612 A | 3/1986 | Shukla et al. | |
| 4,606,154 A | 8/1986 | Herrmann et al. | |
| 4,698,070 A | 10/1987 | Ohno | |

(Continued)

FOREIGN PATENT DOCUMENTS

EP 0 081 775 B1 6/1983

(Continued)

OTHER PUBLICATIONS

Akatsuka, et al., "Effect of Substrate Materials on CVD Diamond Growth," Editors *Applications of Diamond Films and Related Materials*, Editors Y. Tzeng, et al., Elsevier Science Publishers B.V., pp. 379-381, 1991.

(Continued)

*Primary Examiner*—Eileen P. Morgan
(74) *Attorney, Agent, or Firm*—Kilpatrick Stockton LLP

(57) ABSTRACT

The present invention relates to a composite material and the method of making same, which comprises a CVD diamond coating applied to a composite substrate of ceramic material and an unreacted carbide-forming material of various configurations and for a variety of applications. One example of the composite material is a composite of SiC and free silicon metal known as Reaction-Bonded Silicon Carbide. Several examples of applications of the invention include: 1) heads or disks for conditioning polishing pads, including pads used in Chemical-Mechanical-Planarization, 2) cutting and dressing tool inserts and tips, 3) heat spreaders for electronic devices, and 4) wear components including mechanical seals and pump seals.

18 Claims, 17 Drawing Sheets

U.S. PATENT DOCUMENTS

| | | | |
|---|---|---|---|
| 4,707,384 | A | 11/1987 | Schachner et al. |
| 4,990,403 | A | 2/1991 | Ito |
| 4,991,362 | A | 2/1991 | Heyer et al. |
| 4,992,082 | A | 2/1991 | Drawl et al. |
| 5,125,822 | A | 6/1992 | Kasprzyk |
| 5,126,206 | A | 6/1992 | Garg et al. |
| 5,186,973 | A | 2/1993 | Garg et al. |
| 5,206,083 | A | 4/1993 | Raj et al. |
| 5,272,009 | A | 12/1993 | Schachner et al. |
| 5,318,836 | A | 6/1994 | Ito et al. |
| 5,376,444 | A | 12/1994 | Grotepass et al. |
| 5,435,815 | A | 7/1995 | Ikegaya et al. |
| 5,445,887 | A | 8/1995 | Casti |
| 5,454,750 | A | 10/1995 | Cosmano et al. |
| 5,485,804 | A | 1/1996 | Adair et al. |
| 5,536,202 | A | 7/1996 | Appel et al. |
| 5,543,210 | A | 8/1996 | Kullander et al. |
| 5,551,959 | A | 9/1996 | Martin et al. |
| 5,643,669 | A | 7/1997 | Tsuei |
| 5,665,201 | A | 9/1997 | Sahota |
| 5,705,262 | A | 1/1998 | Bou et al. |
| 5,707,409 | A | 1/1998 | Martin et al. |
| 5,833,753 | A | 11/1998 | Herlinger et al. |
| 5,921,856 | A | 7/1999 | Zimmer |
| 5,958,794 | A | 9/1999 | Bruxfoort et al. |
| 5,997,650 | A | 12/1999 | Herlinger et al. |
| 6,054,183 | A | 4/2000 | Zimmer et al. |
| 6,165,616 | A | 12/2000 | Lemelson et al. |
| 6,194,317 | B1 | 2/2001 | Kaisaki et al. |
| 6,267,867 | B1 | 7/2001 | Olson |
| 6,439,986 | B1 | 8/2002 | Myoung et al. |
| 6,632,127 | B1 | 10/2003 | Zimmer et al. |
| 2003/0036341 | A1 | 2/2003 | Myoung et al. |

FOREIGN PATENT DOCUMENTS

| | | |
|---|---|---|
| EP | 0 454 114 A1 | 10/1991 |
| EP | 0 540 366 A1 | 5/1993 |

OTHER PUBLICATIONS

Bhat, et al., "A preliminary investigation of the effect of post-deposition polishing of diamond films on the machining behaviour of diamond-coated cutting tools," *Diamond and Related Materials*, 4:921-929 (1995).

Chae, et al., "Dependence of the diamond coating adhesion on the microstructure of SiC-based substrates," *Diamond and Related Materials*, 8:1018-1021 (1999).

Nesladek, et al., "Improved adhesion of VD diamond films to steel and WC-Co substrates," *Diamond and Related Materials*, 3:98-104 (1994).

Schmidt, et al., "Using fluorine and chlorine in the diamond CVD process," *Diamond and Related Materials*, Publishers Elsevier, pp. 231-235, 1999.

Schaefer, et al. "Chemical Vapour Deposition of Polycrystalline Diamond Films on Steel Substrates," *Applications of Diamond Films and Related Materials: Third International Conference*, Editors, A. Feldman, et al., pp. 399-402, 1995.

Pierson, Handbook of Carbon, Graphite, Diamond and Fullerenes, Noyes Publications, Park Ridge, p. 326, 1993.

Pan, et al., "Diamond: Electronic Properties and Applications," Kluwer Academic Publisher, Boston, pp. 424-425, 1995.

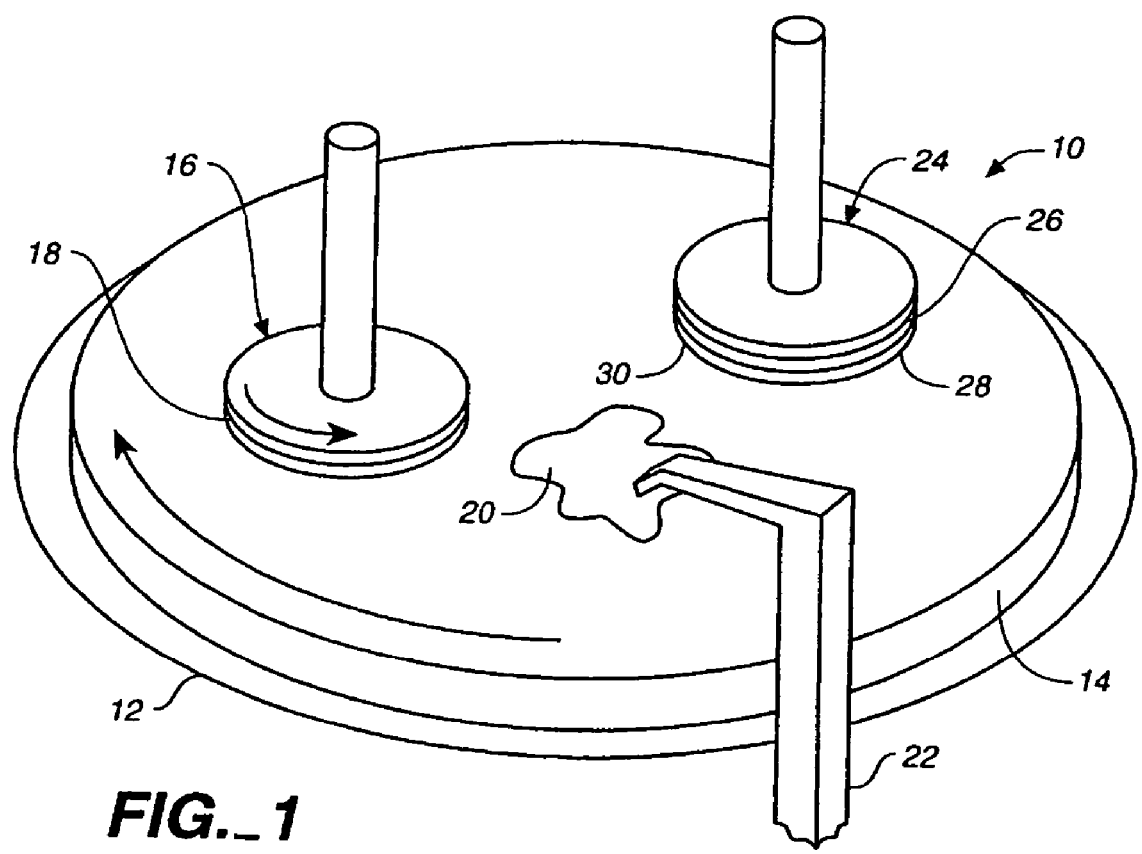
FIG._1

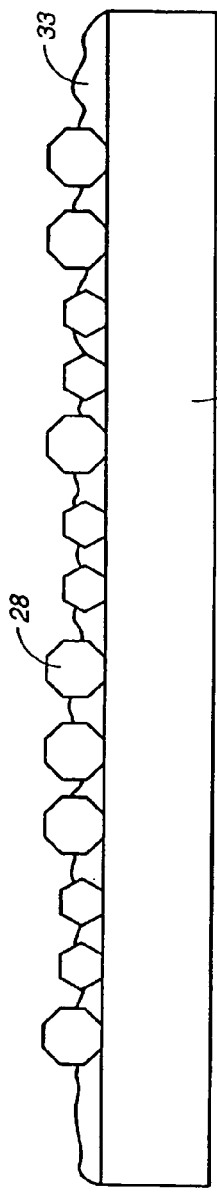
FIG._2
(PRIOR ART)
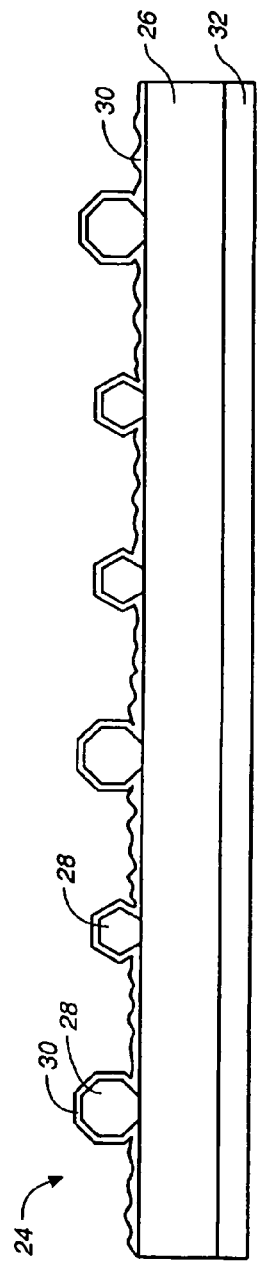
FIG._3
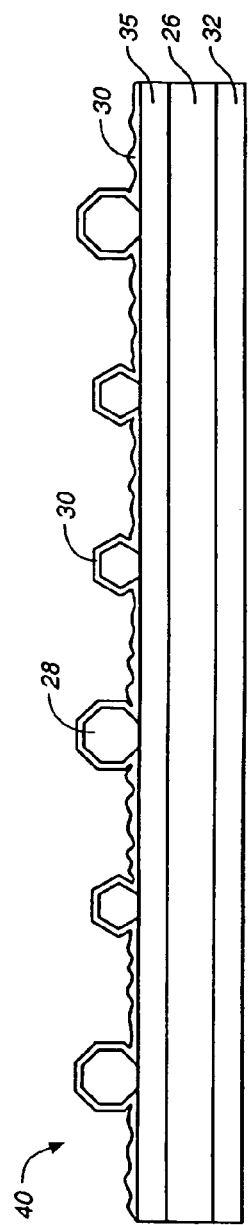
FIG._4

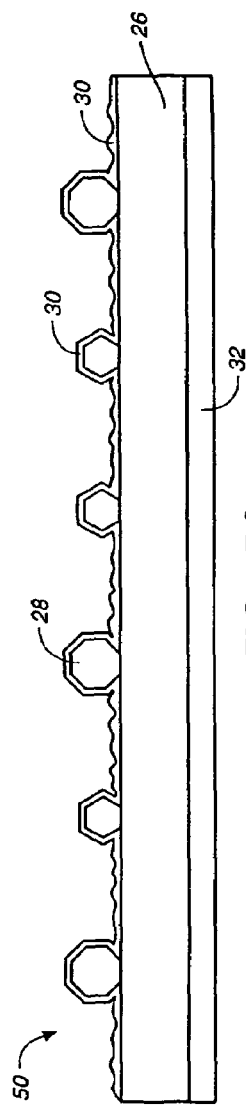
FIG._5A
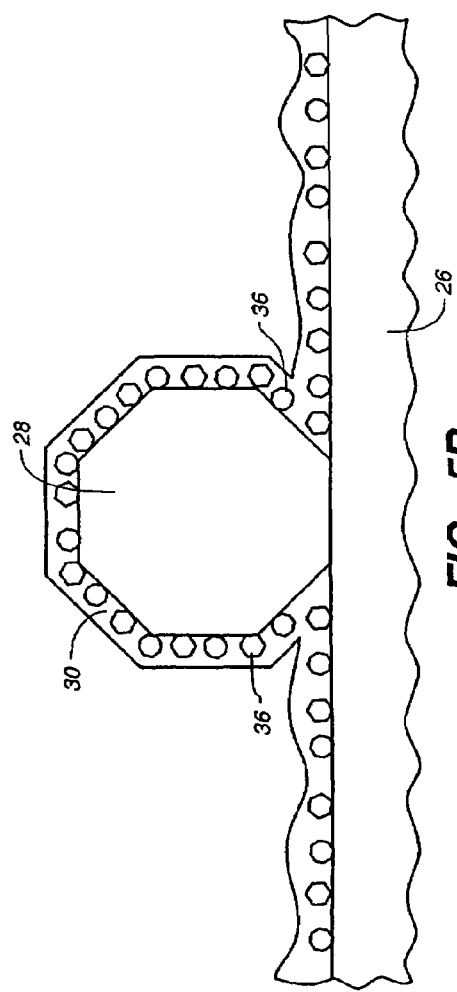
FIG._5B
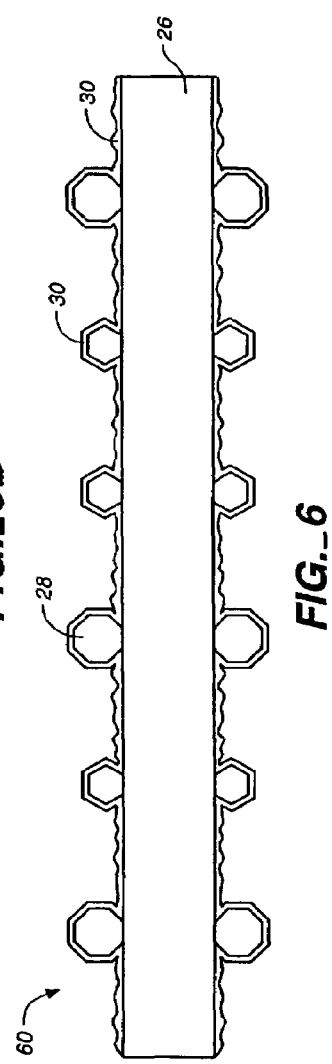
FIG._6

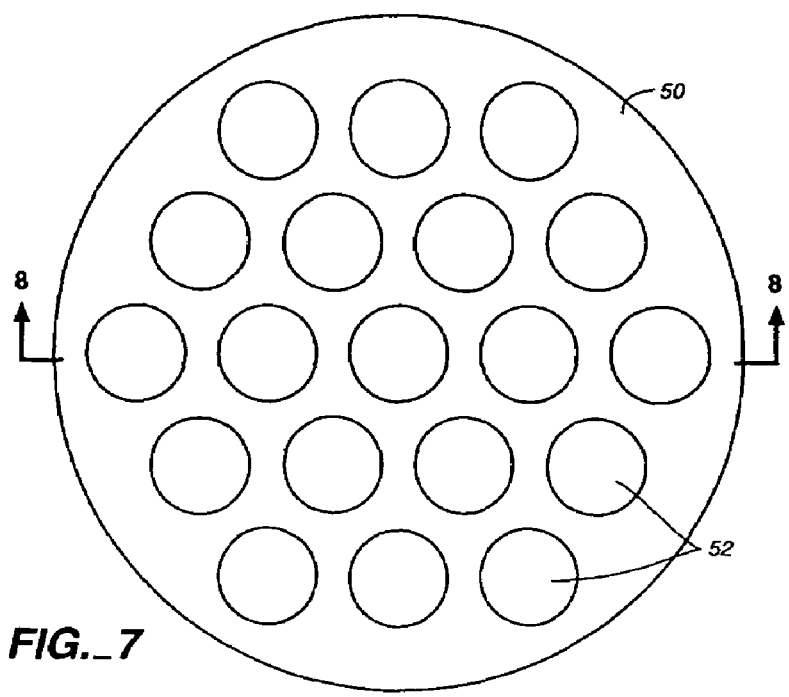
FIG._7
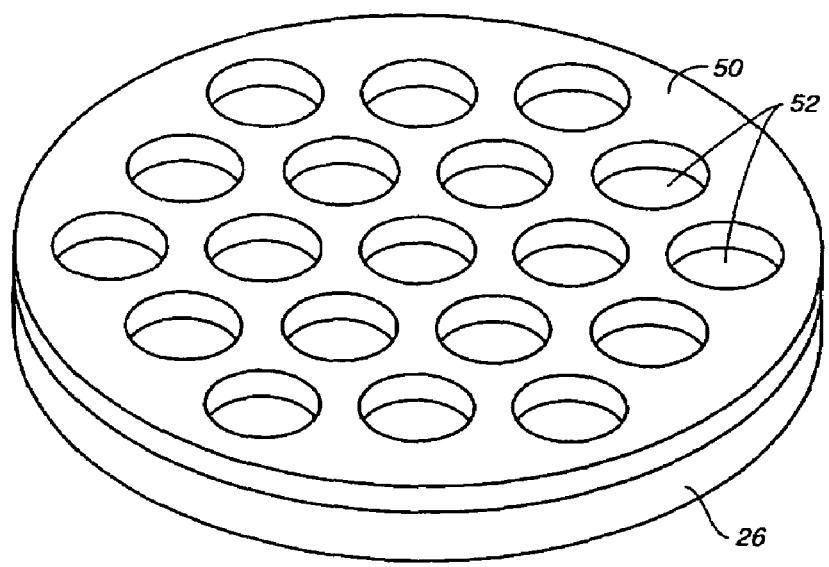
FIG._7A
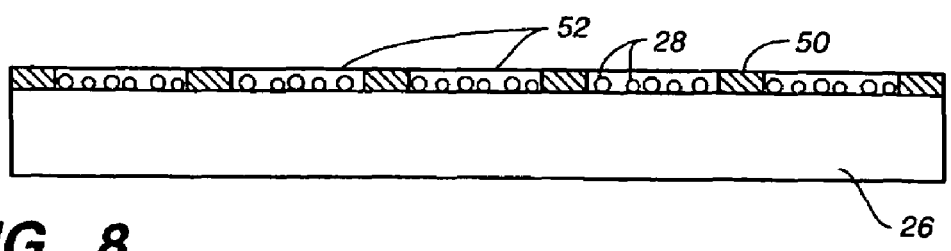
FIG._8

*FIG._9A*
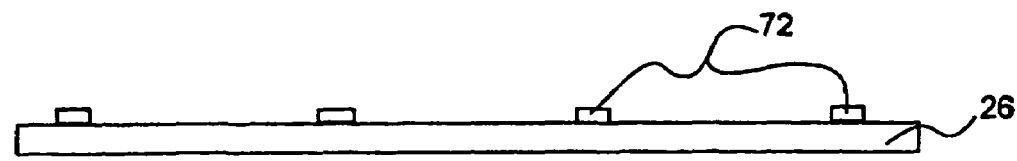
*FIG._9B*
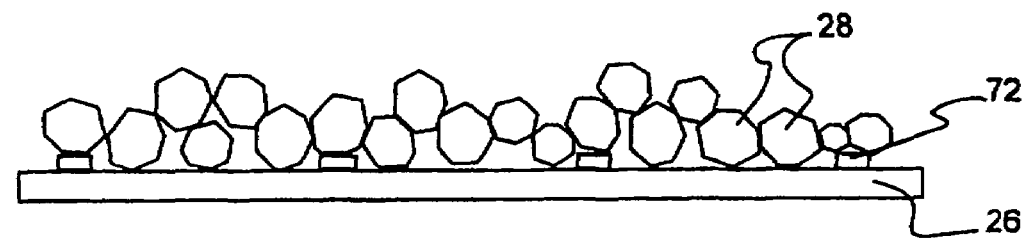
*FIG._9C*
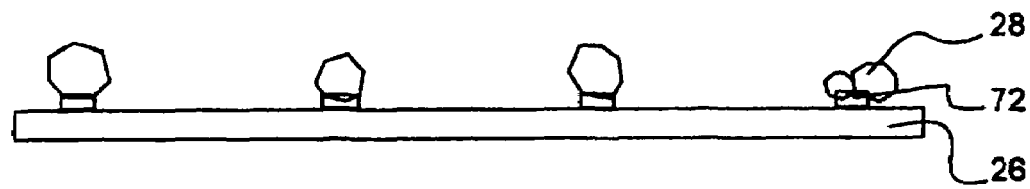
*FIG._9D*
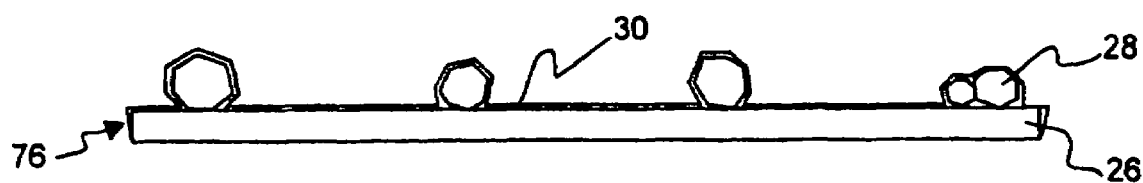
*FIG._9E*

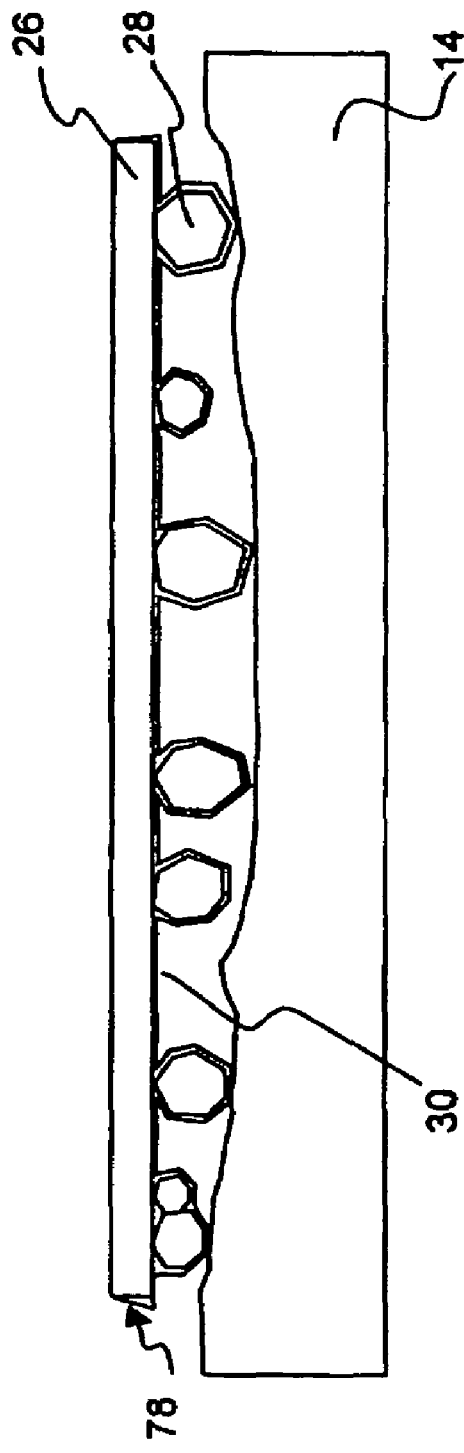
FIG._10
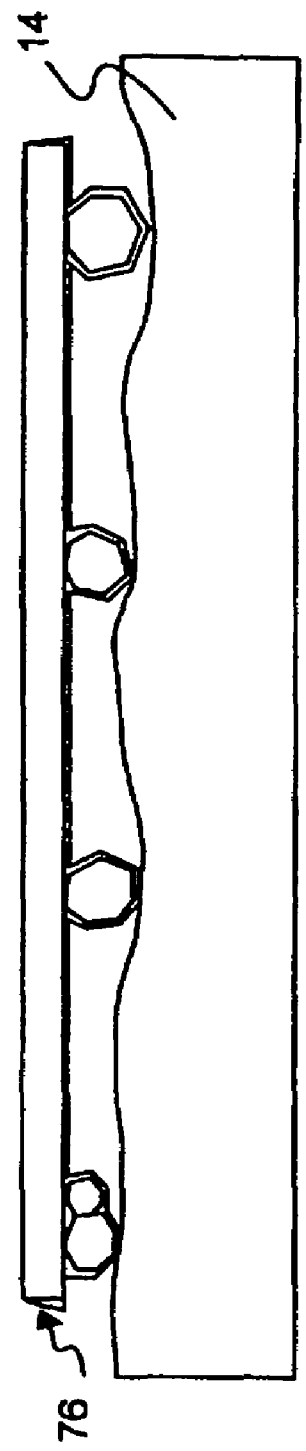
FIG._11

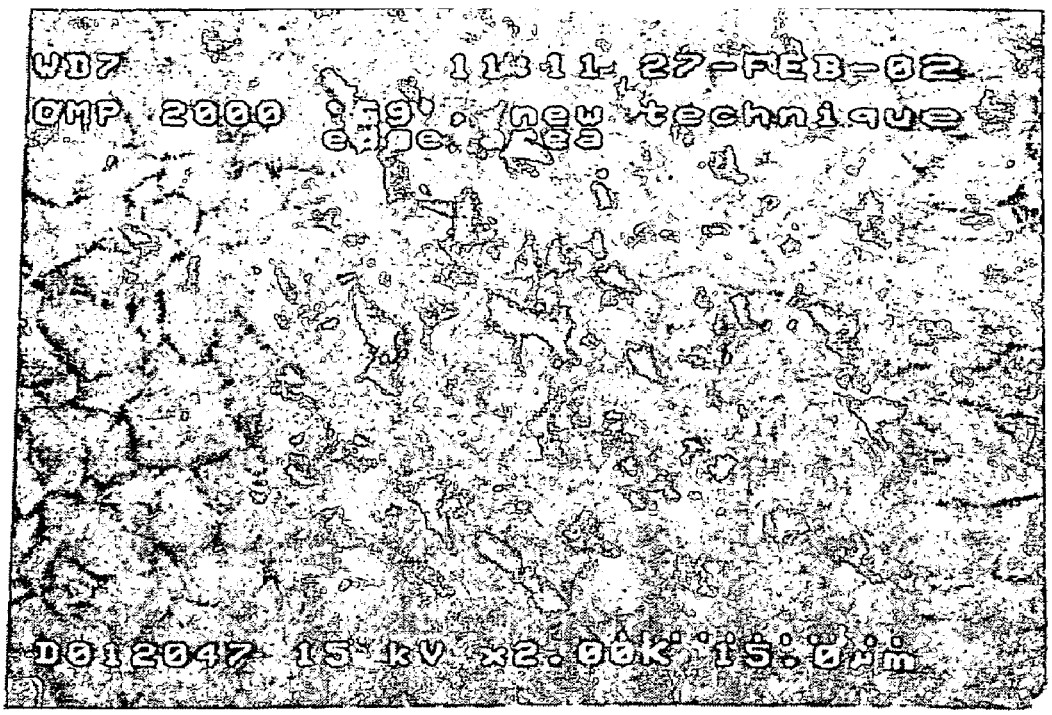
FIG._12A
FIG._12B

FIG._12C

*FIG._13A*
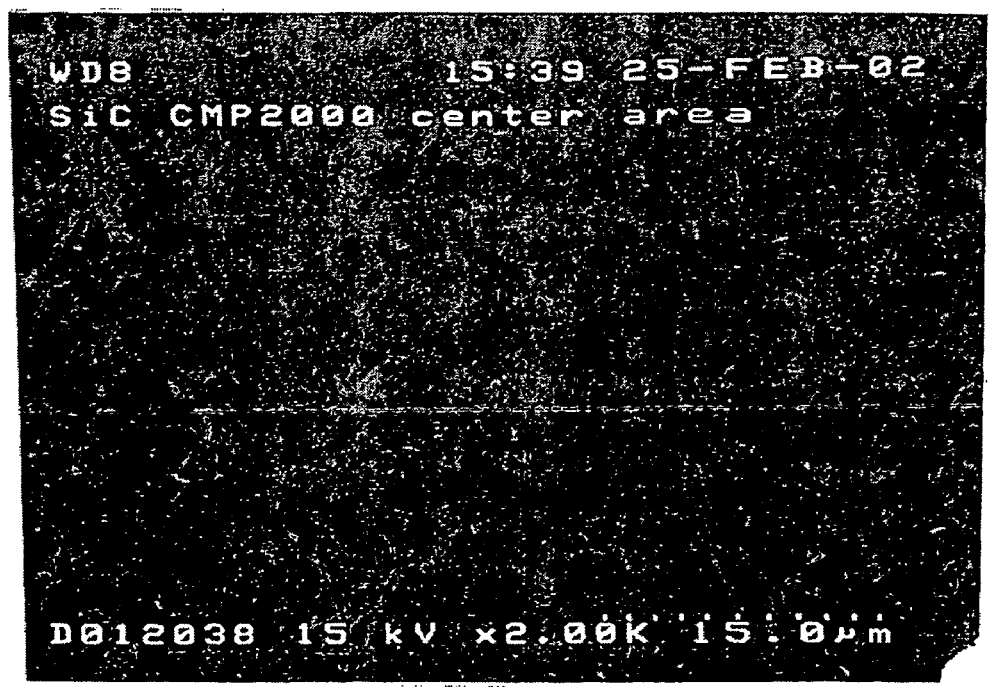
*FIG._13B*

*FIG._14A*
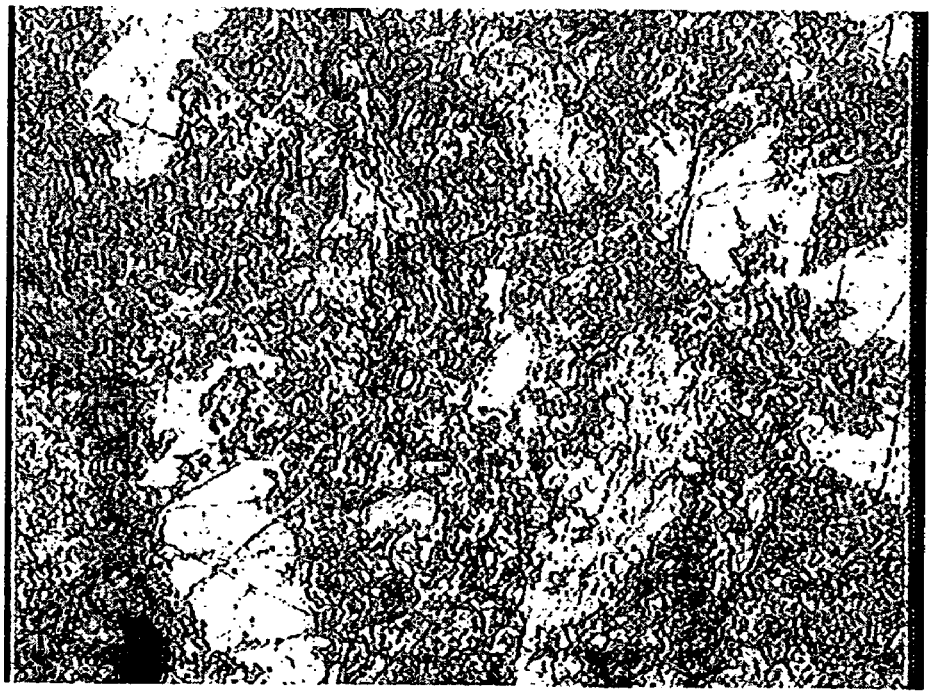
*FIG._14B*

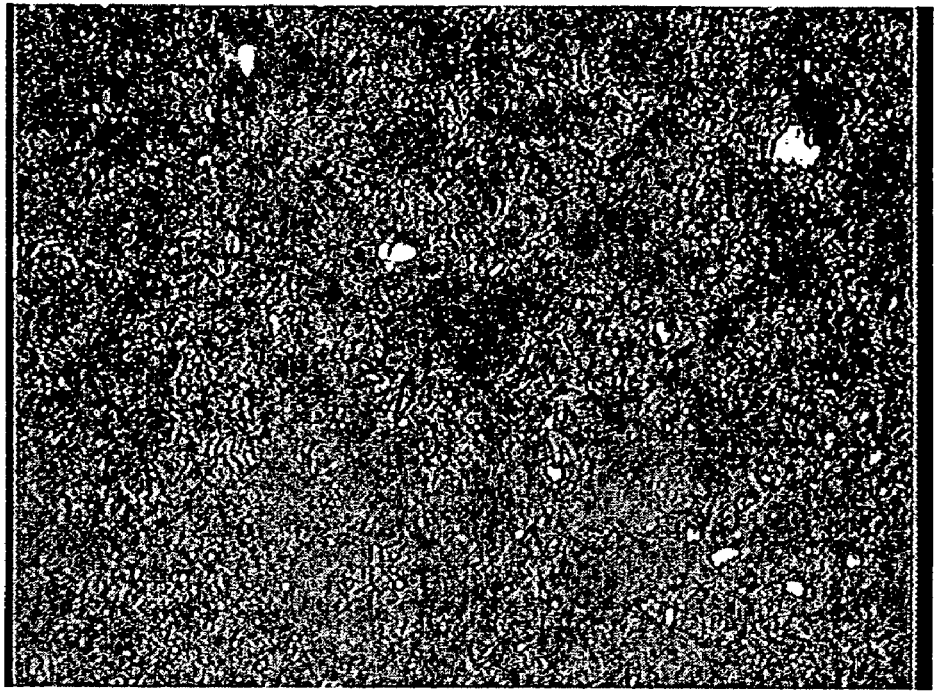
FIG._14C
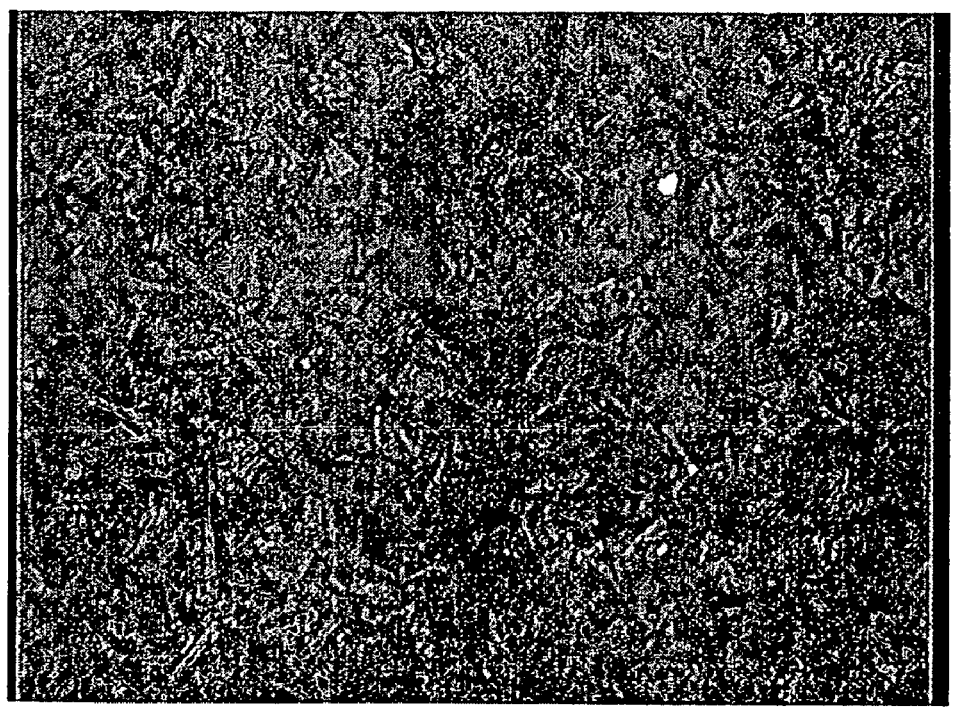
FIG._14D

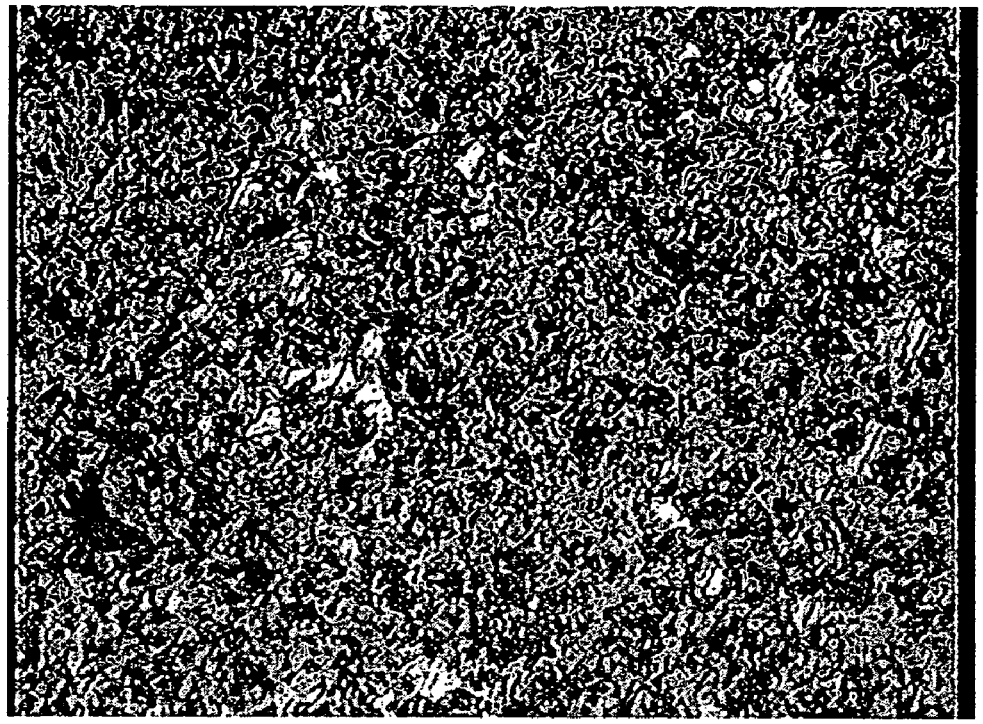
FIG._15A
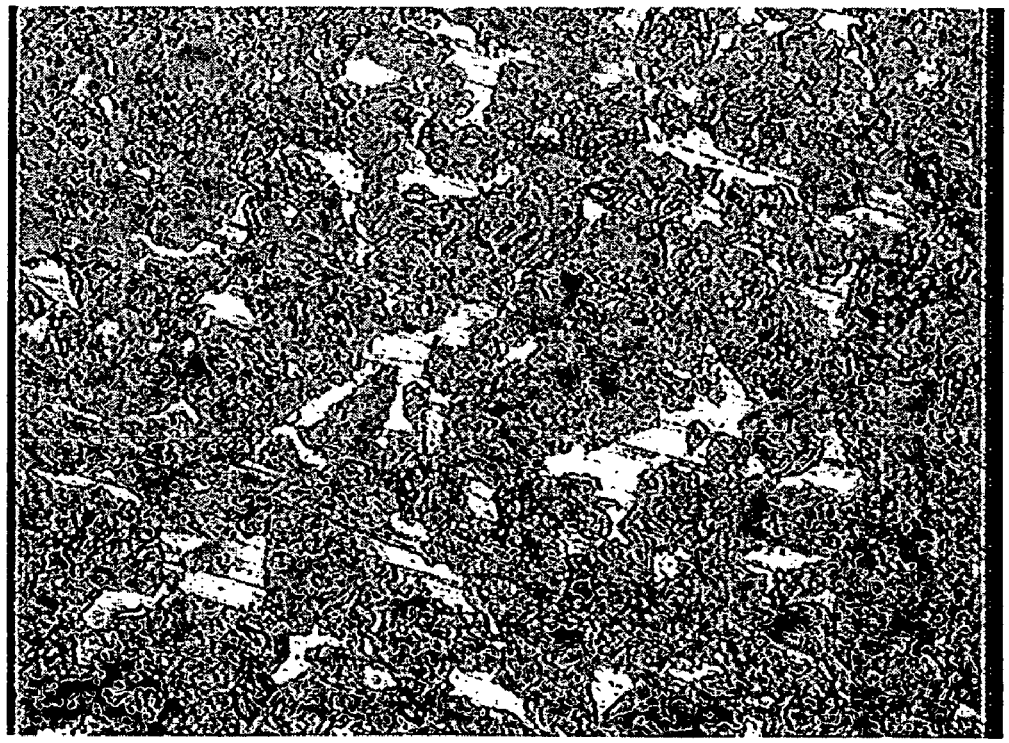
FIG._15B

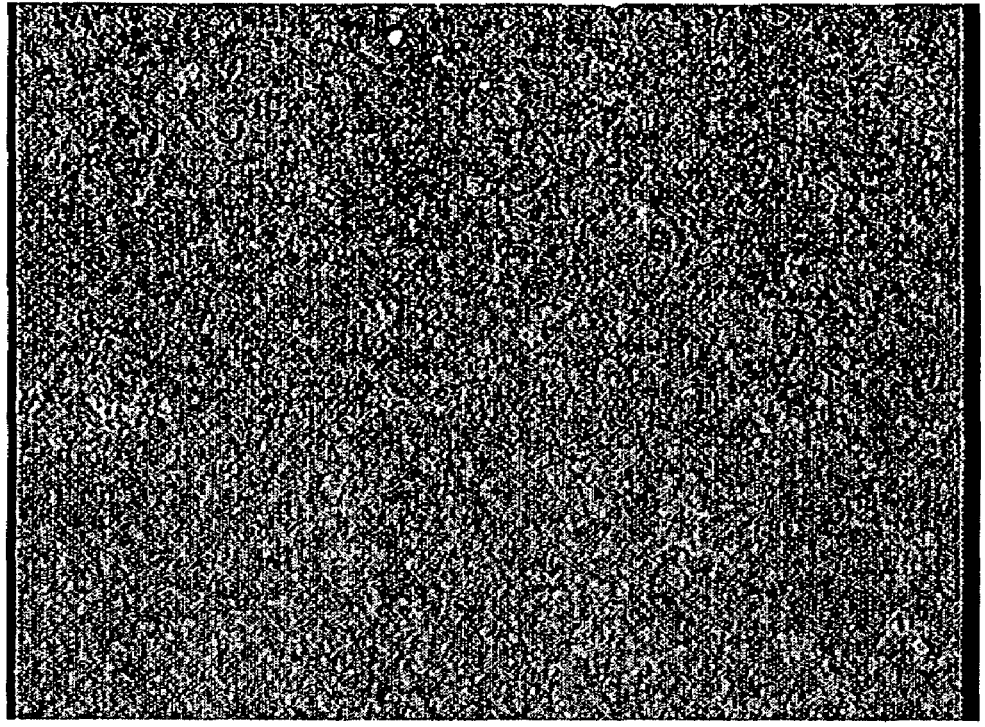
FIG._15C
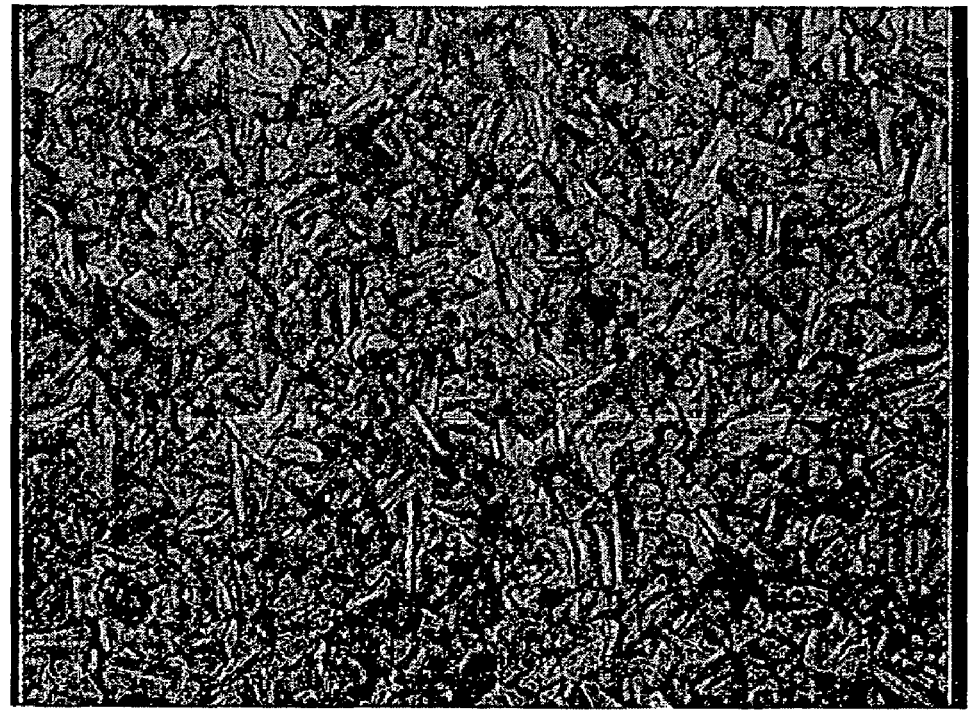
FIG._15D

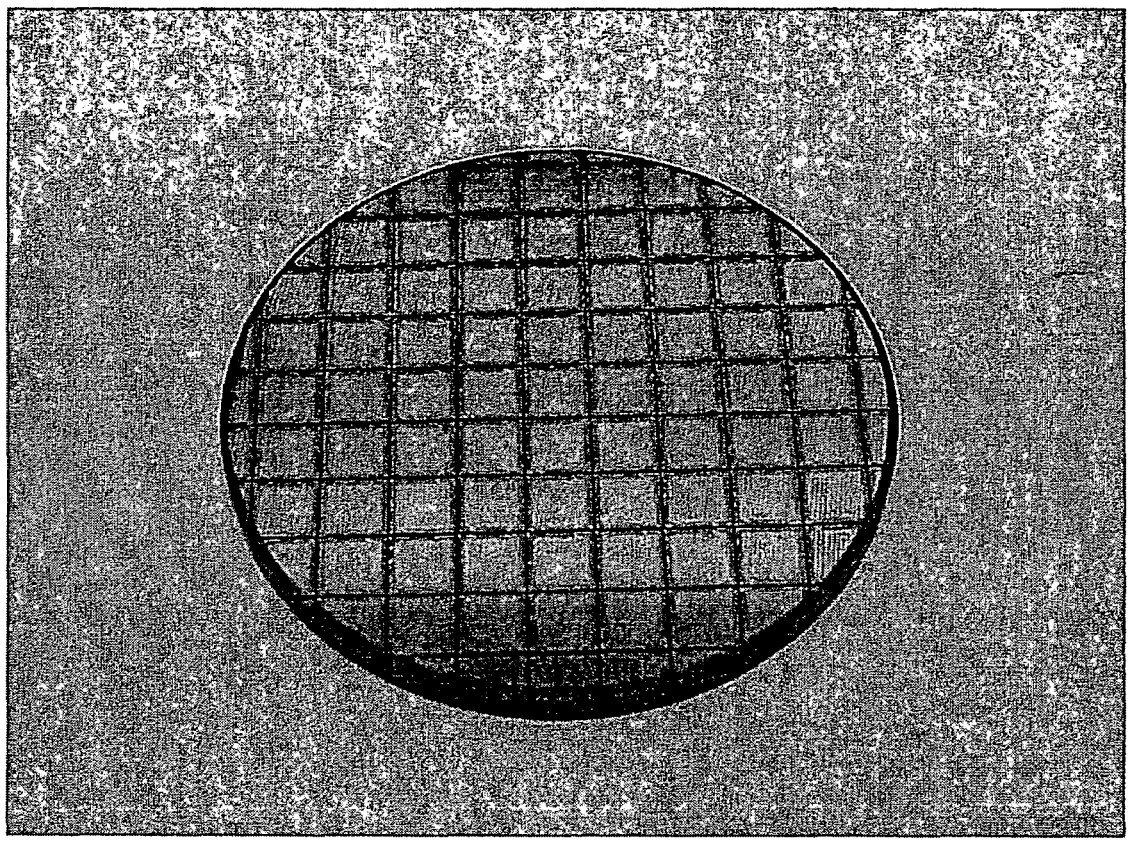
FIG._16

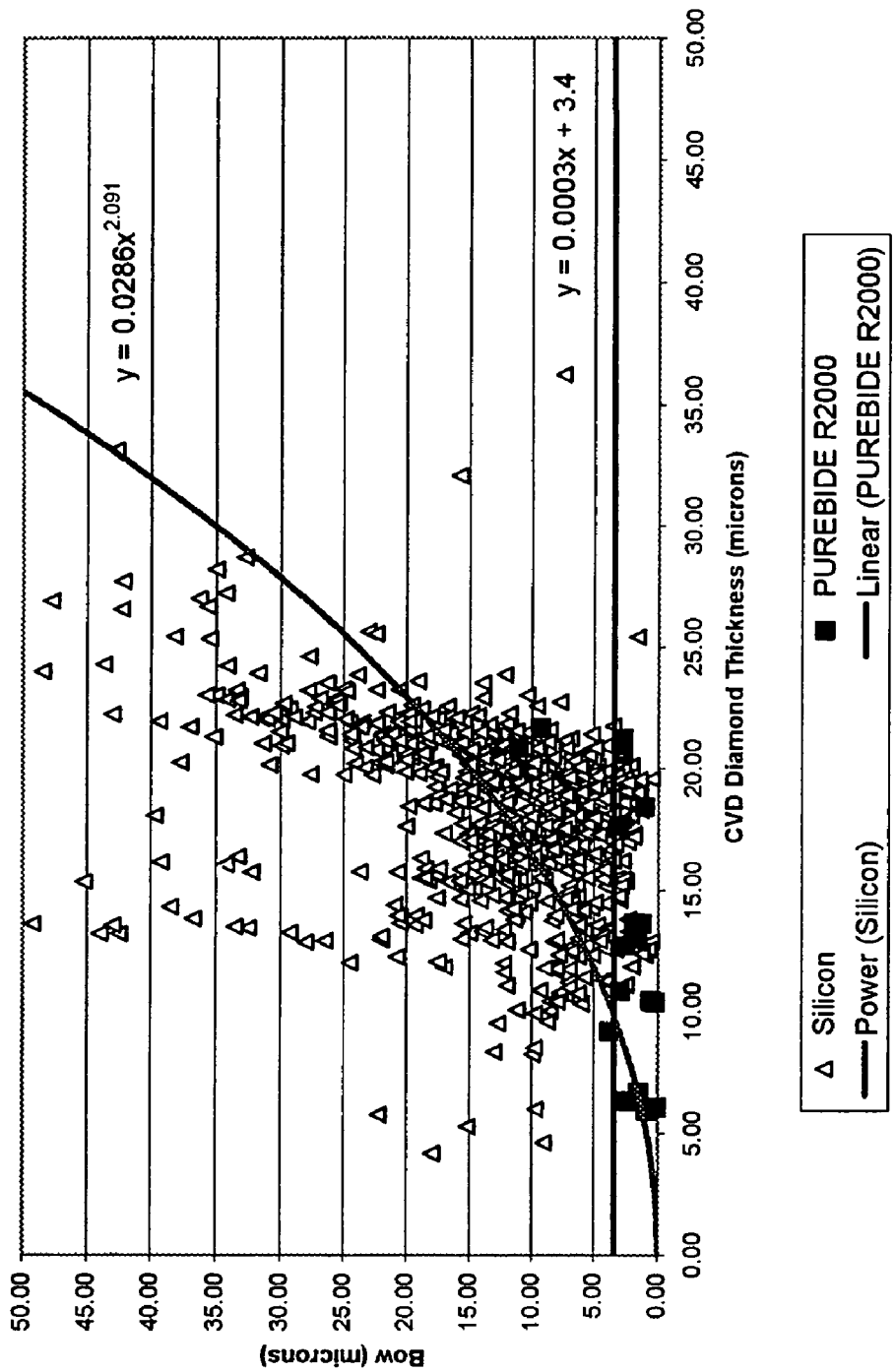
FIG._18A

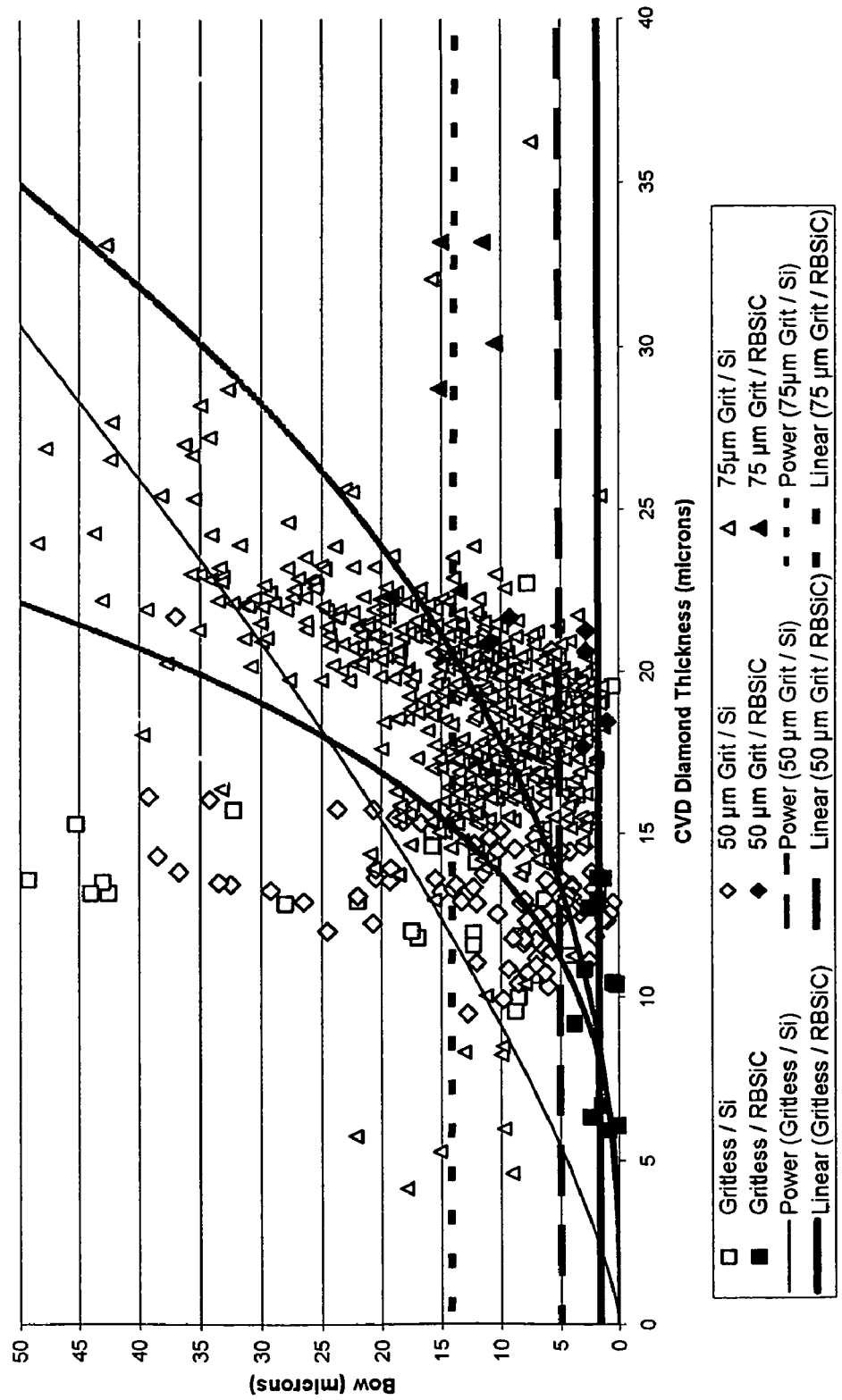
FIG._18B

CVD DIAMOND-COATED COMPOSITE SUBSTRATE CONTAINING A CARBIDE-FORMING MATERIAL AND CERAMIC PHASES AND METHOD FOR MAKING SAME

CROSS REFERENCE TO RELATED APPLICATION

This application is a divisional of U.S. Ser. No. 10/627,931 filed on Jul. 25, 2003 now abandoned, the contents of which are incorporated by reference herein.

BACKGROUND OF THE INVENTION

1. Field of the Invention

The present invention relates to a material product comprising a layer of CVD diamond coating applied to a composite substrate of ceramic material and a carbide-forming material of various configurations and for a variety of applications, and methods for manufacturing these products. The products of the invention have utility in a wide variety of applications, which include: heads or disks for the conditioning of polishing pads, including pads used in Chemical-Mechanical-Planarization (CMP), cutting and dressing tool inserts and tips, wear components, such as mechanical seals and pump seals, and heat spreaders for electronic devices.

2. Description of Related Art

CMP is an important process in the fabrication of integrated circuits, disk drive heads, nano-fabricated components, and the like. For example, in patterning semiconductor wafers, advanced small dimension patterning techniques require an absolutely flat surface. After the wafer has been sawn from a crystal ingot, and irregularities and saw damage removed by rough polishing, CMP is used as a final polishing step to remove high points on the wafer surface and provide an absolutely flat surface. During the CMP process, the wafer will be mounted in a rotating holder or chuck, and lowered onto a pad surface rotating in the opposite direction. When a slurry abrasive process is used, the pad is generally a cast and sliced polyurethane material, or a urethane coated felt. A slurry of abrasive particles suspended in a mild etchant is placed on the polishing pad. The process removes material from high points, both by mechanical abrasion and by chemical conversion of material to, e.g., an oxide, which is then removed by mechanical abrasion. The result is an extremely flat surface.

In addition, CMP can be used later in the processing of semiconductor wafers, when deposition of additional layers has resulted in an uneven surface. CMP is desirable in that it provides global planarization across the entire wafer, is applicable to all materials on the wafer surface, can be used with multimaterial surfaces, and avoids use of hazardous gases. As an example, CMP can be used to remove metal overfill in damascene inlay processes.

CMP represents a major portion of the production cost for semiconductor wafers. These CMP costs include those associated with polishing pads, polishing slurries, pad conditioning disks and a variety of CMP parts that become worn during the planarizing and polishing operations. The total cost for the polishing pad, the downtime to replace the pad and the cost of the test wafers to recalibrate the pad for a single wafer polishing run can be quite high. In many complex integrated circuit devices, up to five CMP runs are required for each finished wafer, which further increase the total manufacturing costs for such wafers.

With polishing pads designed for use with abrasive slurries, the greatest amount of wear on the polishing pads is the result of polishing pad conditioning that is necessary to place the pad into a suitable condition for these wafer planarization and polishing operations. A typical polishing pad comprises closed-cell polyurethane foam approximately $\frac{1}{16}$ inch thick. During pad conditioning, the pads are subjected to mechanical abrasion to physically cut through the cellular layers of the surface of the pad. The exposed surface of the pad contains open cells, which trap abrasive slurry consisting of the spent polishing slurry and material removed from the wafer. In each subsequent pad-conditioning step, the ideal conditioning head removes only the outer layer of cells containing the embedded materials without removing any of the layers below the outer layer. Such an ideal conditioning head would achieve a 100% removal rate with the lowest possible removal of layers on the polishing pad, i.e., lowest possible pad wear rate. It is apparent that a 100% removal rate can be achieved if there were no concern for its adverse affect on wear of the pad.

However, such over-texturing of the pad results in a shortening of the pad life. On the other hand, under-texturing results in insufficient material removal rate during the CMP step and lack of wafer uniformity. Using the conventional conditioning heads that achieve satisfactory removal rates, numbers of wafer polishing runs as few as 200 to 300 and as many as several thousand (depending on the specific run conditions) can be made before the pad becomes ineffective and must be replaced. Replacement typically occurs after the pad is reduced approximately to half of its original thickness.

As a result, there is a great need for a conditioning head that achieves close to an ideal balance between high wafer removal rates and low pad wear rate so that the effective life of the polishing pad can be significantly increased without sacrificing the quality of the conditioning.

One alternative to the urethane polishing pads described above is a woven or non-woven fiber CMP pad, which may incorporate polyurethane. Like the polyurethane pads, the woven pads are designed for use with an abrasive slurry, but provide an alternative to polyurethane CMP pads that gives finer polishing. While the weave of these pads is quite dense, there is opportunity for slurry particles to become trapped within the weave. These particles must be removed from the weave during conditioning. Efficiency of removal of used slurry components must be balanced against damage to the fibers of the weave caused by contact with the conditioning head surface, which can cause excessive breakage of the fibers.

An alternative to CMP polishing pads designed for use with an abrasive slurry, known as a "fixed abrasive" polishing pad, has been developed in order to avoid the disadvantages associated with using a separate slurry composition. One example of such a polishing pad is the 3M Slurry-Free CMP Pad #M3100. This pad contains a polymer base upon which have been deposited 0.2-micron cerium oxide abrasive in approximately 40 micron tall×200 micron diameter pedestals. These pads also require conditioning, because the CMP polishing rate obtained when using the pads is highly sensitive to the surface properties of the abrasive. Initial "breaking in" periods for these polishing pads, during which consistent quality polishing is difficult to obtain, tend to be long, and the resulting loss of wafers is an added expense. Proper conditioning of these pads can reduce or eliminate this break-in period, and reduce or avoid the loss of production wafers.

Typical diamond-containing conditioning heads have a metal substrate, e.g., a stainless steel plate, with a non-uniform distribution of diamond grit over the surface of the plate and a wet chemical plated over-coat of nickel to cover the plate and the grit. The use of such conventional conditioning heads is limited to the conditioning of polishing pads that have been used during oxide CMP wafer processing, i.e. when the exposed outer layer of the polishing pad is an oxide-containing material as opposed to metal. In processing a semiconductor wafer, there are about the same number of oxide and metal CMP processing steps. However, the conditioning heads described above are ineffective for conditioning polishing pads used in metal CMP processing, because the slurry used to remove metal from the wafer can react with the nickel and degrade and otherwise dissolve the nickel outer layer of the conditioning head. Dissolution of the nickel overcoat can result in a major loss of the diamond grit from the plate, potentially scratching the wafers.

In addition, these typical conditioning heads use relatively large sized diamond grit particles. Similar large particles are disclosed in Zimmer et. al. (U.S. Pat. Nos. 5,921,856 and 6,054,183, the entire contents of each of which are incorporated herein by reference). Instead of using a nickel overcoat, Zimmer et al. bond the diamond grit to the substrate with a chemical vapor deposited polycrystalline diamond film ("CVD diamond"). The diamond grit, commercially available from the cutting of natural diamonds and front industrial grade diamonds using high-pressure processes, is incorporated into the structure of the thin CVD diamond film. The size of the grit is chosen so that the peak-to-valley surface distance is grater than the thickness of the CVD diamond film. The diamond grit is uniformly distributed over the surface of the substrate at a density such that the individual grains are separated by no less than ½ the average grain diameter. The average size of the diamond grit is in the range of about 15 microns to about 150 microns, preferably in the range of about 35 microns to about 70 microns. By controlling the size and surface density of the diamond grit, the abrasive characteristics of the resulting surface can be adjusted for various conditioning applications. The grain sizes on a given disk will be relatively consistent in size, to approximately ±20%.

Roughness of a surface can be measured in a number of different ways, including peak-to-valley roughness, average roughness, and RMS roughness. Peak-to-valley roughness (Rt) is a measure of the difference in height between the highest point and lowest point of a surface. Average roughness (Ra) is a measure of the relative degree of coarse, ragged, pointed, or bristle-like projections on a surface, and is defined as the average of the absolute values of the differences between the peaks and their mean line. RMS roughness (Rq) is a root mean square average of the distances between the peaks and valleys. "Rp" is the height of the highest peak above the centerline in the Sample length. "Rpm" is the mean of all of the Rp values over all of the sample lengths. Rpm is the most meaningful measure of roughness for gritless CMP pads, since it provides an average of the peaks that are doing the bulk of the work during conditioning. However, a new generation CMP pads, including fixed abrasive pads and many woven pads, cannot be conditioned by conventional conditioners because conditioning heads having grit particles larger than 15 microns are too rough; the large grit particles tend to damage the pad.

An alternative to using diamond grit is disclosed in U.S. Ser. No. 10/091,105, filed Mar. 4, 2002, the entire contents of which are incorporated herein by reference. The application describes the use of CVD diamond coating on a polished silicon substrate, without the use of diamond grit, to create the abrasive surface and to control the conditioning rate. The surface roughness resulting from simply growing CVD diamond on a silicon substrate ranges from about 6 to 12 microns from peak-to-valley on a substrate having a thickness of 25 microns of CVD diamond. In general, the surface roughness for a typical operation ranges from about ¼ to about ½ the thickness of the CVD diamond that is grown on the substrate. This degree of surface roughness can provide the desired abrasive efficiency for CMP conditioning operations for fixed abrasive CMP pads. However, difficulties with this approach are the lack of independent control of the particle size and density of working diamond grains, and the resulting bow of the diamond-coated silicon substrate product.

While silicon has been used successfully as a substrate for CVD diamond in preparation of some CMP pad conditioners, in accordance with the invention of this application, it has been found that a silicon substrate does not provide sufficient rigidity to support diamond coatings of sufficient thickness to provide optimal CMP conditioning in some applications with sensitive pad materials. Because of both internal growth stress in CVD diamond materials, and the mismatch in thermal coefficients of expansion between diamond and silicon, a CVD diamond-coated silicon substrate conditioning head will bow or bend, even when supported by a metal backing plate, resulting in a conditioner that is not completely flat. A bowed conditioning head does not provide as consistent conditioning as a flat conditioning head, and is thus less desirable.

In addition to CMP pad conditioners, CVD diamond materials and coatings are also used in applications such as cutting tools, wear components and heat spreaders. In each of these applications, the selection of the substrate on to which the diamond is deposited is governed by a number of considerations, including not only the mechanical, thermal, chemical, and/or electrical properties necessary for that particular application, but also by the ability of the CVD diamond to adhere to the substrate. The deposition of polycrystalline CVD diamond onto a number of different substrates has been reported. These substrates can include metals, such as tungsten, molybdenum, tantalum, silicon, copper, aluminum, or non-metals, such as carbon, silica glass, alumina, silicon carbide, tungsten carbide, titanium carbide, silicon nitride, and boron nitride.

The most commonly used material for cutting tools is "high speed" steel. However, this material is not well suited as a substrate for growing CVD diamond because the deposition process reduces the hardness and strength of the steel. Cemented tungsten carbide is also used frequently in making cutting tools, but CVD diamond does not adhere well to this material without either etching of the surface to remove cobalt, or application of an intermediate layer of material to increase adhesion. Likewise, silicon nitride, another material used in the cutting tool industry, does not provide the high adhesion necessary for CVD diamond coatings for viable commercial application. Use of molybdenum as a substrate results in a high CVD diamond nucleation density, but again the adhesion of CVD diamond to this substrate is poor. CVD diamond does adhere well to silicon substrates, but silicon is too fragile and has a fracture toughness that is too low, to make it suitable as a substrate for cutting tools, wear parts or other mechanical applications.

The use of CVD diamond as a heat spreader for high power density electronic components such as laser diodes, LED's, RF components, and other passive electronic components such as resistors allows reduced junction temperature and increased mean time between failures, or much higher power densities to be achieved with these components. In many applications, however, the use of freestanding CVD diamond substrates is inhibited either by the size of the die, the thickness of the die needed for retrofit into existing packages, and/or the cost of the diamond material for the given application. Whether the cost-to-benefit ratio justifies a freestanding CVD diamond heat spreader depends at least in part on the power densities generated by a particular device. Thus, there still exists a need for a low-cost heat spreader incorporating CVD diamond as an alternative to freestanding CVD diamond heat spreaders.

CVD diamond coatings have been proposed previously as a method of improving wear resistance of a variety of materials, including silicon carbide. The high shear forces and temperatures that are generated in, for example, a dry-running pump seal application, generally result in adhesion failure of CVD diamond coatings on typical pump seal materials, such as sintered silicon carbide. There is still an unmet need for a process to manufacture CVD diamond-coated pump seals that can withstand dry running conditions.

In summary, there remains a need in the art for polishing pad conditioning materials that do not damage CMP pads, and that provide improved surface roughness characteristics, and that do not suffer from bowing. In addition, there remains a need for a substrate material that provides desirable dimensional stability, thermal characteristics, chemical and abrasion resistance, and adhesion to CVD diamond, suitable for use in preparing polishing pad conditioners, cutting tools, wear parts such as pump seals, and heat spreading substrates for electronics.

SUMMARY OF THE INVENTION

The present invention overcomes these prior art problems in the fabrication of CMP pad conditioners, cutting tool inserts and tips, wear components and heat spreaders via the use of a composite ceramic substrate for the deposition of CVD diamond. The present invention overcomes shortcomings in conventional materials by providing a CVD diamond coated ceramic material composite product that has the advantages of high adhesion of the CVD diamond material, and is a strong and tough composite material that is resistant to fracture at a low cost compared to conventional CVD diamond component products.

In its broad aspects, the invention provides a composite article comprising:
  a) a substrate having a surface, and comprising a first phase comprising at least one ceramic material, and a second phase comprising at least one material having a higher adhesion to chemical vapor deposited diamond than the ceramic material; and
  b) a chemical vapor deposited diamond coating disposed on at least a portion of a surface of the substrate.

At least one of the second phase materials is desirably a carbide-forming material, and may be dispersed in a matrix formed by the first phase ceramic material. The regions of carbide-forming material within the composite structure may comprise a coating on one or more pores formed within the regions of the first phase of ceramic material. The regions of carbide-forming material may be formed within the composite structure by infiltration of the carbide-forming material within one or more pores formed within the regions of the first phase ceramic material.

Preferably the ceramic phase comprises between 30 volume % and 99 volume % of the substrate, more preferably between 50 volume % and 95 volume % of the substrate. The carbide-forming phase having a higher adhesion to chemical vapor deposited diamond than the ceramic phase preferably comprises between 1 volume % and 70 volume % of the substrate, more preferably between 5 volume % and 50 volume % of the substrate.

Alternatively, at least one of the first phase ceramic materials may be dispersed in a matrix formed by the second phase carbide-forming material. In this case, the first ceramic phase may comprise one or more grains of the ceramic material dispersed within a matrix of the second phase comprising the carbide-forming material.

In particular the invention advantageously provides a CVD diamond coated composite substrate where the substrate comprises phases of an unreacted carbide-forming material and ceramic material. The CVD diamond coating thickness is between 0.1 micron and 2 mm depending on the application. The invention relates to the discovery that composites of a ceramic material and an unreacted phase of a carbide-forming material provides an excellent substrate for deposition and growth of CVD diamond coatings, resulting in materials that can be used in applications such as CMP polishing pad conditioners, cutting tools, wear components, and heat distribution elements such as heat spreaders for use in, e.g., electronics packages.

As used herein, the term "ceramic" is to be interpreted in its widest sense as including not only oxides but also non-oxide materials, for example such as, silicon carbide or silicon nitride. The ceramic material phases of the composite substrate of the present invention provide the stiffness required to maintain the diamond-coated composite product flat; the presence of the second phase material (the carbide-forming material) provides strength and toughness, resulting in a very strong, tough, and adherent composite diamond-coated product. As used herein, the term "carbide-forming material" means a material that is capable, under appropriate conditions, of formation of a covalently bonded compound with carbon in a carbide. It is believed that regions of the carbide-forming material react with the depositing CVD diamond material to form regions of bonded carbide structures at the interface between the substrate and the CVD diamond layer, resulting in strong adhesion of the diamond layer to the substrate.

In a more particular embodiment, the ceramic phase is composed of silicon carbide and the unreacted phase of carbide-forming material is silicon metal. This material, known as Reaction-Bonded Silicon Carbide ("RBSiC"), has considerably better fracture toughness than does pure silicon, and provides much better dimensional stability, resulting in a flatter CVD diamond-coated composite product, such as a polishing pad conditioner. In particular, reaction-bonded silicon carbide or graphite-silicon carbide composites having dispersed therein a dispersed phase of silicon metal, or having grains of silicon carbide dispersed within a silicon metal matrix, have been found to be particularly suitable substrates for CVD diamond coatings.

In one embodiment, the invention relates to a composite material comprising a surface and having a first phase comprising silicon carbide, a second phase comprising silicon metal, and a layer of chemical vapor deposited diamond adhering to at least a portion of the surface. The invention also relates to a polishing pad conditioning head comprising a substrate having a surface and comprising a first phase comprising silicon carbide, a second phase comprising silicon metal, optional diamond grit particles, and a polycrystalline diamond coating disposed on at least a portion of the substrate. In a particular embodiment, this polishing pad conditioner does not contain an adhesive layer disposed between the silicon carbide surface and the polycrystalline diamond surface. Put another way, in this particular embodiment, at least a portion of the silicon carbide in the substrate is in direct contact with the polycrystalline diamond layer.

In addition, the invention relates to the discovery that damage to fixed abrasive pads (and other sensitive CMP pads) resulting from contact with conditioning heads can be considerably reduced by avoiding the presence of large diamond crystals in the conditioning head surface. Large crystals have been found to provide a disproportionate share of conditioning, but also to cause a disproportionate share of damage to the CMP polishing pad. A reduced level of such crystals was found to be obtainable through the preparation of conditioning heads surfaces that are significantly more homogeneous than previously available on previously described surfaces. However, this reduced number of large crystals and improved homogeneity of the surface results in the necessity to increase the down force applied to the conditioner in order to obtain the desired level of conditioning using commercially available CMP polishing equipment. Increased homogeneity can be achieved by carefully controlling the particle size distribution of any diamond grit applied to the surface, carefully controlling the density of grit particles per unit area of the coated substrate, or growing a CVD diamond layer on pre-roughened substrates, so that the roughness of the diamond layer is in part determined by the surface roughness of the substrate.

In another embodiment, the invention is directed to a polishing pad conditioning head which has a substrate, a layer of diamond grit having an average grain size ranging from about 1 to about 15 microns, substantially uniformly distributed on the substrate, and an outer layer CVD diamond grown onto the resulting grit covered substrate to at least partially encase and bond said polycrystalline diamond grit to said surface. In a particular embodiment, the resulting conditioning head contains a grit-covered substrate encased in polycrystalline CVD diamond having a thickness of at least about 20% of the grit size.

In another embodiment, the conditioning head also contains diamond grit having an average diameter of less than 1 micron. This smaller grit is substantially uniformly distributed over the substrate and first layer of grit.

In another embodiment, the conditioning head contains a substrate that has been coated with a first layer of CVD polycrystalline diamond prior to distributing the layer or layers of diamond grit, and the grit coated surface is then coated with a second layer of CVD polycrystalline diamond. In this embodiment, the diamond grit may include the layer of 1-micron to 15-micron diamond grit described above, or may also include the less than 1-micron diamond grit, also described above.

Any of the above-described embodiments may contain a substrate that has been coated on one or both sides thereof, and the coatings may be the same or different, so long as at least one coating falls within the scope of one of the embodiments described above.

In another embodiment, the invention relates to methods for making the polishing pad conditioning heads described above. One embodiment of the method involves:

(a) uniformly distributing a first layer of diamond grit having an average particle diameter in the range of about 1 to about 15 microns over an exposed surface of a substrate to achieve an average grit density in the range from about 100 to about 50000 grains per $mm^2$;

(b) chemical vapor depositing an outer layer of polycrystalline diamond onto the exposed surface of the grit covered substrate; and (c) recovering a polishing pad conditioning head having a grit covered substrate encased in polycrystalline diamond having a thickness of at least about 20% of the grit size.

Similarly, when a layer of polycrystalline diamond is to be deposited prior to distribution of the diamond grit, the method involves:

(a) chemical vapor depositing a layer of polycrystalline diamond onto an exposed surface of a substrate;

(b) uniformly distributing a first layer of diamond grit over an exposed surface of said layer of polycrystalline diamond to achieve an average grit density in the range from about 100 to about 50000 grains per $mm^2$;

(c) chemical vapor depositing an outer layer of polycrystalline diamond onto the exposed surface of the grit covered substrate; and (d) recovering a polishing pad conditioning head having a grit covered substrate encased in polycrystalline diamond having a thickness of at least about 20% of the grit size. In this embodiment of the invention, the diamond grit may range widely in size, from as small as submicron grit to greater than 100 microns. In a particular embodiment, the average diameter of the diamond grit is in the range of about 1 to about 15 microns.

When diamond grit is desired on two sides of the substrate, the method for making the conditioning head includes:

(a) uniformly distributing a layer of diamond grit having an average particle diameter in the range of about 1 to about 150 microns over an exposed surface of a first side of a substrate to achieve an average grit density in the range from about 100 to about 50000 grains per $mm^2$;

(b) chemical vapor depositing an outer layer of polycrystalline diamond onto the exposed surface of the grit covered side;

(c) cooling said substrate;

(d) uniformly distributing a layer of diamond grit having an average particle diameter in the range of about 1 to about 150 microns over an exposed surface of a second side of said substrate to achieve an average grit density in the range from about 100 to about 50000 grains per $mm^2$;

(e) repeating steps (b) and (c); and (f) recovering a polishing pad conditioning head having both sides of said substrate covered with grit and encased in polycrystalline diamond having a thickness of at least about 20% of the grit size for each side.

In another embodiment, the invention relates to a polishing pad conditioning head having substrate material comprising a first phase of a ceramic material and a second phase of a carbide-forming material, described above, and:

a first layer of diamond grit having an average grain size in the range of about 15 microns to about 150 microns and substantially uniformly distributed with respect to an exposed surface of the substrate; and wherein the layer of chemical vapor deposited diamond disposed on the diamond grit-covered substrate, whereby the layer of chemical vapor deposited diamond at least partially encases and bonds the diamond grit to the substrate. More particularly, the diamond grit can range from about 15 microns to about 75 microns.

In another embodiment, the invention relates to polishing pad conditioning heads having a substrate, and a CVD diamond coating deposited thereon, wherein the surface of the coating has an average roughness (Ra) of at least about 0.30 microns, more particularly, at least about 0.40 microns. It is believed that this degree of surface roughness can provide enhanced conditioning results on non-fixed abrasive pads, as compared to conditioning heads with lower roughness levels.

The conditioning head of the invention is suitable for the conditioning of polishing pads that require very gentle conditioning. The conditioning head for a CMP and similar types of apparatus has been found to condition the pads without unnecessary damage to the structure of the pad. This in turn has extended the life of the polishing pad without sacrificing wafer removal rates and methods for making the polishing pads. In addition, the conditioning head of the present invention:

(1) is effective in conditioning polishing pads used to process metal as well as oxide surfaces;

(2) is manufactured so that the diamond grit is more firmly attached to the substrate and consequently does not detach from the substrate to potentially scratch the wafer; and (3) provides a greater degree of uniformity of material removed across a given wafer.

The conditioning heads of the present invention can be used to condition either fixed abrasive pads or pads for use with abrasive slurries. This invention is capable of conditioning polishing pads used to planarize and/or polish both dielectric and semiconductor (oxide) films and metal films on semiconductor wafers as well as to planarize and/or polish wafers and disks used in computer hard disk drives.

In another embodiment, the invention relates to a method of substantially uniformly depositing diamond grit on a substrate, comprising:

suspending particles of diamond grit in an alcohol;

applying the suspension to a substrate surface having a net positive charge;

removing excess diamond particles from the surface; and evaporating the alcohol.

In another embodiment, the invention relates to a method for making the composite substrate material coated according to the embodiments described above. A porous ceramic body is formed from particles of ceramic materials such as silicon carbide, silicon nitride, silicon aluminum oxynitride, aluminum nitride, tungsten carbide, tantalum carbide, titanium carbide, boron nitride, and similar materials and combinations thereof. The ceramic material can desirably be silicon carbide. The porous ceramic body is infiltrated with a carbide-forming material, such as silicon, titanium, molybdenum, tungsten, niobium, vanadium, hafnium, chromium, zirconium, and other materials, including mixtures of these, with silicon being particularly suitable. In all cases, the choice of ceramic and carbide-forming materials must be chosen from materials that are stable in the environment used to deposit diamond via chemical vapor deposition, i.e. stable in an atmosphere containing hydrocarbon and a large concentration of hydrogen at temperatures in the range of about 600° C. to about 1100° C.

In another embodiment, the invention relates to a cutting tool blanks made of a composite material comprising a composite substrate of ceramic material and a carbide-forming metal (e.g., RBSiC) with a CVD diamond coating of between 1 and 2000 microns thickness, more particularly between about 10 microns and about 1000 microns. The CVD diamond surface and the surface of the composite substrate can be finished using an appropriate surface finishing technique to obtain the desired surface conditions and overall thickness. The diamond surface finish can be a matte (lapped) surface or a polished surface, whichever is needed for the cutting tool application.

In another embodiment, the invention relates to a composite material heat spreader comprising (1) a composite substrate of ceramic material and a carbide-forming metal, e.g. RBSiC, and (2) a CVD diamond coating of between 1 and 500 microns thickness. The CVD diamond surface and the surface of the composite substrate may further be polished and/or metallized to provide a suitable surface for attachment of the electronic device.

In another embodiment, the invention relates to a wear component such as a mechanical seal comprising a composite substrate of ceramic material and a carbide-forming metal, e.g. RBSiC, with a CVD diamond coating of between 1 and 100 microns in thickness. The CVD diamond surface may or may not be polished to provide a suitable sealing or wear surface for the application. In addition, the mating surface may be manufactured from the same composite structure.

BRIEF DESCRIPTION OF DRAWINGS

FIG. 1 illustrates a CMP apparatus in accordance with the present invention;

FIG. 2 illustrates a diagrammatic cross-sectional view of a polishing pad conditioning head in accordance with prior methods for making such conditioning heads;

FIG. 3 illustrates a diagrammatic cross-sectional view of a polishing pad conditioning head in accordance with one embodiment of the present invention;

FIG. 4 illustrates a diagrammatic cross-sectional view of a polishing pad conditioning head in accordance with another embodiment of the present invention;

FIG. 5A illustrates a diagrammatic cross-sectional view of a polishing pad conditioning head in accordance with still another embodiment of the present invention;

FIG. 5B illustrates a detailed cross-sectional view of the polishing pad conditioning head shown in FIG. 5A;

FIG. 6 illustrates a diagrammatic cross-sectional view a polishing pad conditioning head in accordance with another embodiment of the present invention;

FIG. 7 illustrates a top view of a patterned shield used in another embodiment of the present invention;

FIG. 7A illustrates the patterned shield of FIG. 7 on a wafer; and

FIG. 8 illustrates a diagrammatic cross-sectional view of the patterned shield of FIG. 7A and a distribution of diamond grit on the wafer.

FIG. 9A illustrates the first step of using a photoresist pattern in a preferred embodiment of the present invention;

FIG. 9B illustrates the second step of using a photoresist pattern in a preferred embodiment of the present invention;

FIG. 9C illustrates the third step of using a photoresist pattern in a preferred embodiment of the present invention;

FIG. 9D illustrates results after the fourth, fifth and sixth steps of using a photoresist pattern in a preferred embodiment of the present invention;

FIG. 9E illustrates the final step of using a photoresist pattern in a preferred embodiment of the present invention;

FIG. 10 illustrates a diagrammatic cross-sectional view of a polishing pad being conditioned by conditioning head in which the diamond grit is not uniformly distributed on the wafer; and FIG. 11 illustrates a diagrammatic cross-sectional view of a polishing pad being conditioned by conditioning head in which the diamond grit is very uniformly distributed on the wafer in accordance with the process shown in FIGS. 9A-9E.

FIG. 12A is an SEM photograph of a CMP conditioner made with only a CVD diamond coating and no diamond grit. The microstructure of the diamond film has a range of particle sizes.

FIG. 12B is an SEM photograph of a used CMP conditioner made with only a CVD diamond coating and no diamond grit. The microstructure of the diamond film has a range of particle sizes. Only the larger particles show any sign of wear.

FIG. 12C is a higher magnification of FIG. 12B. Clearly the large diamond particle is worn, whereas the neighboring smaller particles are untouched.

FIGS. 13A & 13B are SEM photographs of a CMP conditioner made with only a CVD diamond coating and no diamond grit on a reaction-bonded silicon carbide substrate. The microstructure of the diamond film has a range of particle sizes.

FIGS. 14A and 14B are photomicrographs uncoated samples of silicon carbide graphite composites with silicon matrix, while FIGS. 14C and 14D are photomicrographs of this material coated with CVD diamond.

FIGS. 15A and 15B are photomicrographs of uncoated samples of alpha silicon carbide composite with silicon matrix, while FIGS. 15C and 15D are photomicrographs of this material coated with CVD diamond.

FIG. 16 is a schematic view of a reaction-bonded silicon carbide substrate laser cut and ready for coating with CVD diamond according to the invention.

FIGS. 18A & 18B are graphs showing results of bow testing for composites prepared according to the invention, and for silicon substrates.

DETAILED DESCRIPTION OF SPECIFIC EMBODIMENTS OF THE INVENTION

Figure 17:
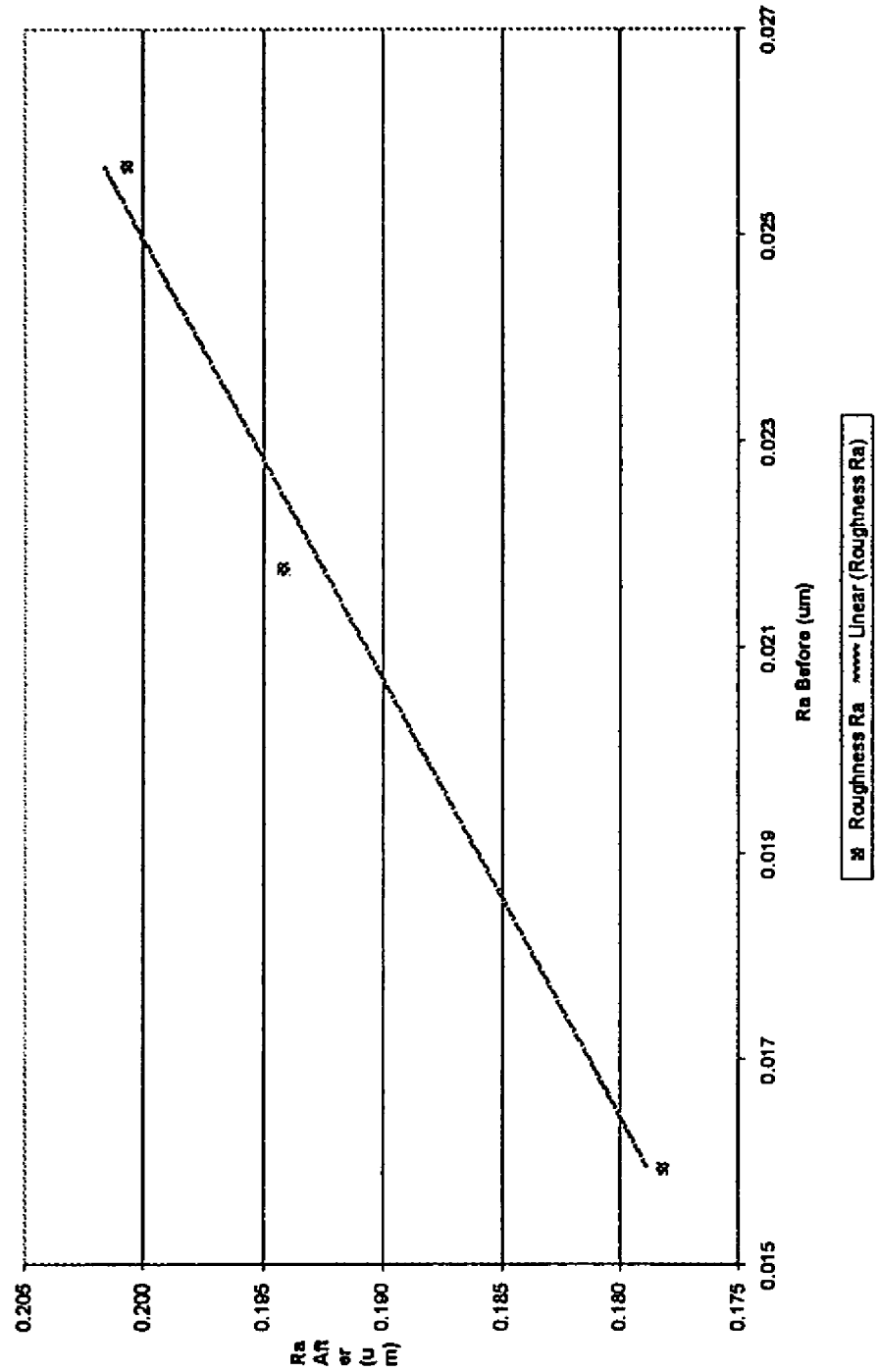
FIG. 17 is a graph showing how initial surface roughness can influence final roughness of the CVD coated material according to the invention.

As used herein, the term "chemically vapor deposited" or "CVD" refers to materials deposited by vacuum deposition processes, including, but not limited to, thermally activated deposition from reactive gaseous precursor materials, as well as plasma, microwave, DC, or RF plasma arc-jet deposition from gaseous precursor materials. Also as used herein, the term "substantially uniformly distributed" refers both to embodiments of the invention where the diamond particles are evenly distributed over the entire substrate surface, and embodiments where the diamond particles are evenly distributed over selected portions of the substrate surface, as when the diamond particles are applied using a mask or shield. As used herein, the term "carbide-forming material" means a material that is capable, under appropriate conditions, of formation of a covalently bonded compound with carbon in a carbide. Examples include silicon, titanium, molybdenum, tantalum, niobium, vanadium, hafnium, chromium, zirconium, and tungsten, or combinations thereof. As used herein, the term "dispersed" means inclusions or phases distributed in a more abundant matrix phase. Desirably, at least a portion of these inclusions are present at one or more surfaces of the material. The inclusions may be in the form of grains or particles, or may form a network of material that is interspersed with the matrix phase. For example, a material containing a matrix phase of silicon carbide and a second phase of silicon metal dispersed in the matrix could be prepared by impregnating porous silicon carbide with molten silicon and allowing the material to cool below the melting temperature of silicon.

CMP apparatus 10 illustrated in FIG. 1 contains platen 12 with polishing pad 14 securely fastened thereto. Polishing pad 14 is shown rotating, for example, in a clockwise direction. Semiconductor wafer holder 16 with wafer 18 is positioned as shown to urge and maintain wafer 18 against the exposed surface of pad 14. Holder 16 is shown rotating, for example, in a counterclockwise direction. Wafer 18 is secured to holder 16 by means of a vacuum or other means well known in the art. Polishing slurry 20 is dispensed within the center region of pad 14 through the nozzle of conduit 22. Slurry 20 typically consists of silicon dioxide dispersed within a suitable liquid, typically an acidic or alkaline etchant solution such as potassium hydroxide diluted with water. The exact composition of the slurry is closely calculated to provide the desired planarization of the exposed surface of the wafer. Although apparatus 10 shows only one wafer holder, CMP equipment is commercially available that includes multiple holders.

Polishing pad conditioning head or disk 24 comprises substrate 26, natural or synthetic diamond grit 28 (shown schematically) evenly distributed over the surface of substrate 26 and a continuous thin film 30 of CVD polycrystalline diamond (hereinafter referred to as "CVD diamond") grown onto grit 28 and substrate 26 so that grit 28 is encased in CVD diamond 30 and bonded to the surface of substrate 26.

A uniform layer 30 of CVD diamond is grown onto the exposed surface of substrate 26 using a hot filament CVD (HFCVD) reactor of the type described and claimed in Garg, et al., U.S. Pat. No. 5,186,973, issued Feb. 16, 1993; the entire contents of which are incorporated by reference herein.

FIG. 2 shows a cross-section of a prior art conditioning head in which a non-uniform layer of diamond grit 28 is distributed on the surface of backing plate 32, such as stainless steel plate, and nickel-plating 33 is deposited by a wet chemical process to insecurely bond the diamond grit 28 to backing plate 32.

FIG. 3 shows a cross-section of conditioning disk 34 that is of substantially the same composition as conditioning head 24 described and containing optional backing plate 32. In a particular embodiment, substrate 26 comprises a composite material comprising a ceramic material, e.g. SiC, and an unreacted carbide-forming material, e.g. Si. The substrate is usually in the form of a disk ranging in diameter from about two (2) to four (4) inches. However, other geometries have been used as the substrate for conditioning heads. The thickness of substrate 26 ranges from about 0.02 to about 0.25 inch, preferably 0.04 to 0.08 inch for a silicon substrate. Thicknesses for other substrates may vary from these ranges. For instance, the silicon carbide-silicon composite substrate may have a thickness ranging from about 0.040 inch to about 0.300 inch, preferably from about 0.120 inch to about 0.180 inch, for a 2 inch diameter substrate. Larger diameter substrates will be correspondingly thicker.

As indicated above, it has been found that substrates containing silicon carbide, in particular reaction-bonded silicon carbide composites, provide properties that are preferable to those of pure silicon substrates, both because of the increased fracture toughness, and because of the increased stiffness of the silicon carbide. To-date, the inability to achieve adequate adhesion of CVD diamond to a silicon carbide substrate has led many in the industry to continue to use silicon substrates. Graphite substrates coated with a layer of silicon carbide, such as PUREBIDE E material available from Morgan Crucible plc, have the strength and density of graphite, but the hardness of SiC. However, this type of material is more difficult to use as a substrate for CVD diamond deposition due to cracking of the SiC coating, and migration of graphite to the surface of the material caused by the CVD coating process. Alpha silicon carbide, such as PUREBIDE S available from Morgan Crucible plc, that has been sintered to full density has excellent properties of high density, hardness, and flexural and compressive strength. It has been found that CVD diamond can be successfully grown on this material. However, the adhesion strength of CVD diamond to this material has been found to be inconsistent, so that the material may be less suitable for applications in wear parts and cutting tools, but may be suitable as a heat spreader where other properties of the substrate become more important.

It has been found that excellent adhesion results are obtained using composites of silicon carbide and silicon. For example, a silicon carbide-graphite composite, similar to PUREBIDE E, but having a silicon matrix (PUREBIDE G9723, Morgan Crucible plc) has the hardness of the PUREBIDE E graphite-SiC composite, but approximately twice the compressive strength. A sample of such a material is illustrated in FIG. 14. FIGS. 14A (100× magnification) and 14B (400× magnification) are photomicrographs of uncoated PUREBIDE G9723. Silicon carbide grains and regions of Si metal are readily visible. FIGS. 14C (400× magnification) and 14D (800× magnification) are photomicrographs of a sample of PUREBIDE G9723 coated with a thin layer of CVD diamond. The diamond coating contains more {110} structure, which is similar to the microstructure of CVD diamond deposited onto silicon.

Similarly, it has been found that a composite of an alpha silicon carbide with silicon, such as PUREBIDE R9242 or PUREBIDE R2000 available from Morgan Crucible plc, provides excellent adhesion results. PUREBIDE R2000 contains about 10 wt. % to 15 wt. % silicon, or about 13 volume % to 20 volume % silicon in a matrix of silicon carbide ceramic material. The properties of these materials are about 80% of those of PUREBIDE S, but the surfaces of these materials contain a significant amount of silicon, which provides excellent adhesion to a CVD diamond coating due to the strong carbide bond formed between the surface silicon and the deposited layer of CVD diamond. FIG. 15A is a photomicrograph of an uncoated sample of PUREBIDE R9242 (400× magnification). FIG. 15C is a photomicrograph of this material coated with CVD diamond. FIG. 15B is a photomicrograph of an uncoated sample of PUREBIDE R2000, while FIG. 15D is a photomicrograph of a sample coated with CVD diamond. Lighter regions in the uncoated photomicrographs indicate unreacted silicon metal. FIG. 15B shows a larger area of such regions than FIG. 15A. FIG. 15C shows very fine-grained diamond coating, while FIG. 15D shows larger grained adherent CVD diamond.

The use of silicon carbide that has been modified to contain surface regions of silicon metal as a substrate for CVD diamond can be applied to preparation of any CMP conditioning head, and this forms a part of the invention. The particular techniques disclosed herein for producing particular roughnesses of diamond coating, whether using particular size distributions of grit, or using a gritless coating, form a separate and novel embodiment of invention. These techniques may be used with the composite silicon carbide substrate disclosed herein, or may be used with any other suitable substrate material, as described above. Accordingly, the techniques below may be used with the silicon carbide substrate of the invention, or may be used with other substrates, including conventional substrates known in the art, and remain novel. Similarly, the composite silicon carbide substrate of the invention can be used with the diamond coating techniques described herein, or with other diamond coatings, including conventional diamond coatings known in the art, and remain novel.

Preparation of polishing pad conditioning head or disk 34 in FIG. 3 is performed according to the following method. In the first step, a layer, preferably a monolayer, of diamond grit having an average particle diameter in the range of about 1 to about 15 microns is deposited onto substrate 26 in a highly uniform manner. The density of this diamond grit on the surface of substrate 26 is about 100 to about 50000 grains per mm$^2$. If desired, an additional "layer" of smaller diamond grit, typically having an average particle size of less than about 1 micron, can be deposited on the grit-covered substrate. Some of this smaller grit may fall atop the larger grit particles already deposited, while other portions of the smaller grit will fall on areas of the substrate not covered by the larger diamond grit. Preferably, the density of small diamond grit on the surface of the substrate is about 400 to about 2000 grains per mm$^2$.

There are several methods for preparation of a layer of diamond grit ("seeding") uniformly on the substrate in the fabrication of a polishing pad conditioner. The first seeding method employs mechanical spreading of diamond grit by an air dispersion technique in which diamond grit is dropped at a controlled rate from a fixed height onto the substrate. A moving air current may be used to disperse the grit in a lateral direction across the substrate. The grit container may be moved in a direction orthogonal to the direction of the air current while the grit is dropped onto the substrate to provide a uniform distribution of grit across the entire exposed surface of the substrate. The substrate may be rotated during this procedure to improve the uniformity of the distribution of diamond grit on the substrate. The density of the grit on the substrate is controlled by both the supply rate of the grit feed as well as the rate of translation of the substrate.

Alternatively, the substrate may be moved in an orthogonal direction while the grit is being dropped onto the wafer to provide a uniform distribution of grit across the entire exposed surface of the substrate.

In a variation of this seeding method, a pre-measured amount of diamond grit is placed on a small surface above the surface of the substrate. A timed high velocity jet of air is aimed at this grit and the grit is blown into a cloud in a contained region above the surface of the substrate. The grit subsequently settles out of the cloud onto the surface of the substrate in a very uniform pattern. Density of the grit in the pattern is controlled by and proportional to the amount of grit blown into the cloud.

Even more uniform distributions of diamond grit particles over the entire substrate surface can be obtained by one of several non-mechanical techniques, which are discussed below as the second through fifth seeding methods.

In the second seeding method, in accordance with Adair, et al, U.S. Pat. No. 5,485,804, incorporated herein by reference, the substrate is coated with a thin film of polymer such as polyethyleneimine (PEI), which is capable of producing a positive electrical charge on the surface. The polymer-coated surface is then immersed in an aqueous suspension of diamond particles. Because the diamond particles in suspension have a negative charge, which is opposite that of the polymer-coated surface, the diamond particles are attracted to the surface and adhere to the surface via strong electrostatic forces. The diamond-seeded substrate is then rinsed with water to remove excess diamond particles, leaving behind essentially a monolayer of diamond particles on the surface.

The third seeding method is similar to the second method, except a non-aqueous suspension of diamond particles is utilized. The uniformity and control of the seeding process is improved by using a diamond suspension or mixture of diamond particles in alcohol, instead of water as in the '804 patent. The type of alcohol may be methanol, ethanol, propanol, butanol, or other alcohols, but isopropyl alcohol (IPA) is preferred. In the diamond/alcohol mixture, the diamond particles develop a negative surface charge, which causes them to be attracted to the positive charge on polymer-coated substrate surface.

In the fourth seeding method the substrate to be seeded is configured as the positive electrode in a suspension of diamond particles in alcohol, preferably IPA. A negative electrode of similar size is placed opposite and about 1 cm away from the substrate in the solution. The small diamond grit particles are attracted to the substrate by application of a voltage of approximately 5 to 300 V, preferably 50 to 100 V, for time intervals of approximately 5 to 120 seconds. Afterwards, the substrates are removed from the solution and dried by methods such as air-drying or spin-dying.

In the fifth seeding method, the substrate is first covered with a uniform layer of resist. The layer of resist may be applied by spin coating, dry laminating, screen printing, or other methods known in the prior art. This photoresist layer is exposed through a photomask and developed to form a pattern of discrete pads of photoresist on the substrate. Diamond grit is then distributed in a continuous layer across the surface of the substrate and the combination is heated to a temperature at which the grit will stick to the softened photoresist layer. The substrate is cooled and excess grit is removed from the surface leaving only those grit particles, which have adhered to the photoresist pads. Individual placement of grit particles is then achieved with accuracy and location determined by the pattern of the photomask, which is used to expose the photoresist layer. The pattern in the photomask can be adjusted to optimize the performance of the CMP process.

After the application of the monolayer of small diamond grit onto the substrate surface in the preparation of a polishing pad conditioner, a uniform layer 30 of CVD diamond is grown onto the exposed surface of substrate 26. The preferred method of CVD diamond deposition is carried out using a hot filament CVD (HFCVD) reactor of the type described and claimed in Garg, et al., U.S. Pat. No. 5,186,973, issued Feb. 16, 1993; the portions relevant to growing CVD diamonds onto substrates are incorporated by reference herein. However, other CVD methods known in the prior art can be used, such as DC plasma, RF plasma, microwave plasma, or RF plasma arc-jet deposition of diamond from gaseous precursor materials.

Preferably, the CVD diamond is chemically vapor deposited onto the surface of the substrate such that the CVD diamond layer exhibits enhanced crystal orientation in either the <220> or the <311> direction and the <400> direction as compared to the degree of crystal orientation of industrial grade diamonds. The phrase "chemically vapor deposited" is intended to include the deposition of a layer of CVD diamond resulting from the decomposition of a feed gas mixture of hydrogen and carbon compounds, preferably hydrocarbons, into diamond generating carbon atoms from a gas phase, activated in such a way as to avoid substantially graphitic carbon deposition. The preferred types of hydrocarbons include $C_1$-$C_4$ saturated hydrocarbons such as methane, ethane, propane and butane; $C_1$-$C_4$ unsaturated hydrocarbons, such as acetylene, ethylene, propylene and butylene, gases containing C and O such as carbon monoxide and carbon dioxide, aromatic compounds such as benzene, toluene, xylene, and the like; and organic compounds containing C, H, and at least one oxygen and/or nitrogen atom, such as methanol, ethanol propanol, dimethyl ether, diethyl ether, methyl amine, ethyl amine, acetone, and similar compounds. The concentration of carbon compounds in the feed gas mixture can vary from about 0.01% to about 10% by weight, preferably from about 0.2 to about 5% by weight, and more preferably from about 0.5 to about 2% by weight. The resulting diamond film in the HFCVD deposition method is in the form of adherent individual crystallites or a layer-like agglomerate of crystallites substantially free from intercrystalline adhesion binder.

The total thickness of the CVD diamond is desirably at least about 20% of the grit size. Preferably, the total thickness of the diamond film is about 1 to 25 microns. Still more preferably, it is about 1 to 15 microns.

The HFCVD process involves activating a feed gas mixture, containing one or more hydrocarbons and hydrogen, by passing the mixture at sub-atmospheric pressure, i.e. no greater than 100 Torr, over a heated filament, made of W, Ta, Mo, Re or a mixture thereof, and flowing the activated gaseous mixture over the heated substrate to deposit the polycrystalline diamond film. The feed gas mixture, containing from 0.1 to about 10% hydrocarbon in hydrogen, becomes thermally activated producing hydrocarbon radicals and atomic hydrogen. The temperature of the filament ranges from about 1800° C. to 2800° C. The substrate is heated to a deposition temperature of about 600° C. to about 1100° C.

The surface roughness resulting from simply growing CVD diamond on a substrate ranges from about 2 to 5 microns from peak-to-valley on a substrate having a thickness of about 10 microns of CVD diamond. In general, the peak-to-valley surface roughness for a typical CVD diamond layer ranges from about ¼ to about ½ the thickness of the CVD diamond that is grown on the substrate. This degree of surface roughness can provide the desired abrasive efficiency for CMP conditioning operations for the CMP pads mentioned above. One difficulty with this concept is independently controlling the particle size and density of working diamond grains. In several embodiments of the present invention, diamond grit, commercially available from the cutting of natural diamonds and from synthetic industrial grade diamonds, is incorporated into the structure of the thin CVD diamond film. The size of the grit is chosen so that the peak-to-valley surface distance is less than or equal to 15 microns. The diamond grit is uniformly distributed over the surface of the substrate at a density such that only a monolayer of diamond grit particles is establish. The average size of the diamond grit is in the range of about 1 micron to about 15 microns, preferably in the range of about 4 microns to about 10 microns. By controlling the size and density of the diamond grit, the abrasive characteristics of the resulting surface can be adjusted for various conditioning applications.

After uniform distribution of a mono-layer of diamond grit 28 onto the surface of substrate 26 at a density of about 100 to about 50000 grains per $mm^2$, preferably about 400 to about 2000 grains per $mm^2$, and the chemical vapor deposition of diamond outer layer 30 onto grit 28 and substrate 26, the overall thickness of conditioning disk 34 is increased by about 5 to about 20 microns. In the case of silicon substrates, the silicon is can be bonded to backing plate 32 using well known adhesives, in order to give the conditioning disk 34 greater stability. Typically backing plate 32 comprises magnetic stainless steel having a thickness of about 0.04 to 0.08 inch. In the case of the composite ceramic substrates of the present invention, a metal backing plate is not needed to provide support.

FIG. 4 shows a cross-section of conditioning disk 40 in accordance with another embodiment of the present invention in which interlayer 35 of CVD diamond is initially deposited on substrate 26 and then diamond grit 28 is uniformly distributed on the entire exposed surface of CVD diamond interlayer 35. The remaining steps set forth above in the preparation of conditioning disk 34 are repeated resulting in disk 40 in which diamond grit particles 28 can be placed closer together because of the improved bonding of the diamond particles to CVD diamond interlayer 35 before the outer coat 30 of CVD diamond is grown over grit 28. This embodiment is also suitable when diamond grit having a size greater than 100 microns is used.

FIGS. 5A and 5B show a cross-section of conditioning disk 50 in accordance with still another embodiment of the present invention in which substrate 26 is prepared for CVD diamond deposition by a two-step diamond seeding method. In the first step, a monolayer of small diamond grit 28, typically having an average diameter in the range of approximately 1 micron to approximately 15 microns, more typically 4 microns to 10 microns is uniformly applied over the entire exposed surface of substrate 26 at a density of approximately 100 to 50000 grains per $mm^2$. This is followed by the second step in which a layer of smaller diamond seeds 36, typically having a having an average diameter in the range of approximately 0.01 microns to approximately 1 micron is uniformly distributed over the entire exposed surface of diamond grit 28 and the areas of substrate 26 in between particles of large diamond grit 28 at a density in the range of about 1000 to about $10^9$ grains per $mm^2$, preferably about 5000 grains per $mm^2$. Application of the uniform layers of large diamond grit 28 and small diamond seeds 36 may be performed by the aforementioned mechanical dispersion techniques or any of the second through fifth seeding methods. CVD diamond is then grown over the diamond seeds 36 and diamond grit 28 as shown in FIG. 5A so outer layer 30 is polycrystalline diamond instead of epitaxial diamond.

While not wishing to be bound by any theory, it is believed that disk 50 of this embodiment is an improvement over prior art as shown in FIG. 2, as well as over the embodiment of the invention shown in FIG. 3, because of improved bonding between diamond grit 28 and outer layer 30. The smaller diamond seeds 36, covering the larger diamond grit 28 and substrate 26, are believed to grow together to help form a continuous outer layer 30. This enhances the attachment of the large grit 28 to substrate 26 through growth interconnections provided by layer 30, resulting in robust adhesion. It also minimizes the chance of the large diamond grit coming loose during the conditioning pad use. In addition, for the previously described non-mechanical second through fifth seeding methods, the large diamond grit and small diamond seeds are held more securely in place prior to CVD diamond deposition. This helps to make possible deposition onto substrates in either horizontal or vertical fixturing geometry inside the CVD diamond deposition reactor chamber.

FIG. 6 illustrates another embodiment of the present invention in which disk 60 comprises substrate 26 having first side 62 and second side 64 both covered with diamond grit 28 and encased with CVD diamond 30. In this embodiment, substrate 26 having diamond grit 28 on both sides 62 and 64 can be fixtured into a CVD reactor in such a manner well known in the art so that both sides are exposed to the feed gas mixture. Alternatively, substrate 26 is placed in the CVD reactor with diamond grit covered first side 62 exposed and the first side is encased with CVD diamond 30 in a first step. Sequentially, these steps are repeated with diamond grit covered second side 64 exposed and the second side is encased in CVD diamond. Disk 50 can be used for conditioning polishing pads used in double-sided polishers, such as those for polishing silicon wafers and disks used in computer hard disk drives.

FIGS. 7, 7A and 8 show an embodiment of the present invention in which shield 50 having an evenly spaced pattern of shapes, e.g. dots 52, is used to obtain highly uniform distribution of concentrated areas of diamond grit 28 over the exposed surface of wafer 26. Dots 52 can also be in the form of squares, swirls, bars and other shapes. Shield 50 can be of any material, preferably a thermoplastic.

FIGS. 9A-9E show a particular embodiment of the present invention in which coating 70 of a photoresist is applied over the entire exposed surface of substrate 26 (FIG. 9A). Coating 70 of photoresist is exposed though an appropriate mask to form a pattern of photoresist pads or mesas 72 (FIG. 9B). A continuous layer of diamond grit 28 is distributed over mesas 72 and the exposed surface of substrate 26 (FIG. 9C). Substrate 26 having the layer of diamond grit 28 is placed in an oven and heated to about 120° C. (or equivalent softening temperature of the photoresist used) to cause the mesas to soften. This allows that portion of diamond grit 28 distributed on mesas 72 to become embedded in at least the top layer of mesas 72 as shown in FIG. 9D. Substrate 26 is removed from the oven and cooled to room temperature causing diamond grit 28 embedded on mesas 72 to adhere firmly thereto. If the pad size is about 30 to about 60 percent of the size of the diamond grit then there will be only one grit particle, which adheres to each pad. If smaller grit particles are present, then two of the smaller particles may adhere to the pad yielding a composite size, which approximates one of the larger grit particles. The remaining portion of diamond grit 28 is removed from the exposed surface of substrate 26 and is then placed in the CVD reactor and the growth of CVD diamond binder layer 30 is commenced. As a result of the temperatures used during the CVD process, photoresist pad 72 evaporates and/or is consumed by the hydrogen in the reactor and diamond grit 28 settles to the surface of substrate 26 and is encased within CVD diamond binder layer 30 (FIG. 9E). Polishing pad-conditioning head 76 having highly uniform distribution of diamond grit 28 is recovered from the CVD reactor.

FIGS. 9B-9E also illustrate another, similar embodiment of the invention in which coating 70 is a screen printing compound such as ethyl cellulose, rather than a photoresist, and is applied over the entire exposed surface of substrate 26 (FIG. 9B) through a screen printing stencil using well known screen printing techniques. The compound forms a resist pattern of dots composed of the screen printing compound. These dots have substantial tackiness and can be covered with a continuous layer of diamond grit before they have dried, as shown in FIG. 9C. This allows that portion of diamond grit 28 distributed on mesas 72 to become embedded in at least the top layer of mesas 72. After drying excess grit is removed leaving the structure shown in FIG. 9D which and is ready to be placed in the CVD reactor and the growth of CVD diamond binder layer 30 is commenced. As a result of the temperatures used during the CVD process, the screen printed pad 72 evaporates and/or is consumed by the hydrogen in the reactor and diamond grit 28 settles to the surface of substrate 26 and is encased within CVD diamond binder layer 30 (FIG. 9E). Polishing pad-conditioning head 76 having highly uniform distribution of diamond grit 28 is recovered from the CVD reactor.

FIG. 10 shows a prior art conditioning head 78, comprising non-uniformly distributed diamond grit 28 on substrate 26 and encased in CVD diamond layer 30, and the resulting deflection that head 78 makes with polishing pad 14 as head 78 conditions pad 14 in the manner shown in FIG. 1. FIG. 10 shows that as a result of the random distribution of the diamond grit on wafer 26, head 78 makes a non-uniform contact with polishing pad 14. This results in non-uniform wear of head 78.

FIG. 11 shows conditioning head 76 in accordance with an embodiment of the invention, and the resulting deflection head 78 makes with polishing pad 14 as head 78 conditions pad 14 in the manner shown in FIG. 1. Because of the highly uniform distribution of diamond grit 28 on substrate 26, head 76 produces a very uniform deflection of pad 14 and very uniform wear of head 78.

FIGS. 12A, 12B and 12C show the microstructure of a CVD diamond film grown on a silicon substrate. FIG. 12A shows the typical microstructure for 8 micron to 12 micron CVD diamond coating. The microstructure is made up of large and small grains randomly distributed. The size of these grains is directly proportional to the coating thickness. FIGS. 12B & 12C show the wear patterns that develop on a used conditioner. The tops of the larger grains are worn whereas the smaller grains show no signs of wear. The ability to control the distribution and quantity of the larger working grains is difficult to control during the CVD diamond deposition on a silicon substrate.

FIGS. 13A and 13B show a similar microstructure as in FIG. 12A-C, but for a CVD diamond coated reaction-bonded silicon carbide. Reaction-bonded silicon carbide is a sintered silicon carbide body with silicon infiltrated into the pore structure. The reaction-bonded SiC used was PURE-BIDE R2000 (fine grained alpha silicon carbide, reaction-bonded by infiltration of silicon metal, manufactured by Morgan Crucible plc).

As described above, one method for obtaining a narrow distribution of diamond grains and of controlling the size of those diamond grains is to grow CVD diamond on a substrate that has a surface microstructure having the desired consistency of surface characteristics, and growing the diamond to a level sufficient to obtain the desired grain size and surface roughness. One method for obtaining such a material is to use reaction-bonded silicon carbide of the type described above as the substrate. By carefully controlling the surface microstructure of the silicon carbide to have a consistency corresponding to the desired consistency of diamond grains, and by growing CVD diamond on this substrate microstructure to the desired grain size, a consistent diamond surface, without damage-causing large grains, but with an average grain size and average roughness large enough to provide suitable conditioning results, can be obtained. Another technique for obtaining a similar result is to mechanically score or roughen a smooth surface, such as polished silicon, e.g., by contacting it with highly consistent diameter diamond grit sufficiently to score the surface, removing the grit, and growing CVD diamond on the roughened surface to the desired particle size. Alternatively, grooves and/or ridges can be cut, either mechanically or by laser cutting into the surface of the substrate, and CVD diamond grown thereon to provide the appropriate roughness. Exemplary patterns include a grid of intersecting lines, a series of concentric circles or ovals, a spiral pattern beginning at the center of the conditioning head, a series of radial lines extending from a point at or near the center of the conditioning head, and combinations of these. The grooves may have a depth on the order of about 50 microns to 200 microns, typically about 100 microns to 120 microns, a width of about 0.03 mm to 0.1 mm, typically from about 0.04 mm to 0.05 mm, and a spacing of about 3 mm to 10 mm, typically about 5 mm (spacing will obviously vary considerably for radially extending grooves). An example of a reaction-bonded silicon carbide substrate containing laser-cut grooves suitable for coating with CVD diamond is illustrated in FIG. 16.

It is speculated that gritless conditioning heads with a relatively consistent surface having an average roughness (Ra) below about 0.10 micron will generally not provide desirable conditioning results for any of the three types of CMP pads (polyurethane, fibrous, or fixed abrasive). However, average roughness values between about 0.10 micron and about 0.40 micron, more particularly between about 0.15 micron and about 0.30 micron, are believed to be suitable for conditioning fixed abrasive pads. Roughness values higher than about 0.30 micron will generally be suitable for conditioning other types of CMP pads.

For conditioning heads containing diamond grit, average grit densities of at least 400 grains per $mm^2$ and average particle sizes of between about 4 microns and about 15 microns have been found to be suitable, typically with a standard deviation of less than around 1.5 µm for standard cut diamond particles. In one particular embodiment, a conditioner was made utilizing diamond grit with an average particle size of less than 5 microns applied to the surface at an average grit density greater than 2000 grains per $mm^2$.

After the surface of the composite ceramic substrate suitable for cutting tool blanks, heat spreaders, or wear components is prepared, a uniform layer 30 of CVD diamond is grown onto the exposed surface of substrate 26. The preferred method of CVD diamond deposition is carried out using a hot filament CVD (HFCVD) reactor of the type described and claimed in Garg, et al., U.S. Pat. No. 5,186,973, issued Feb. 16, 1993; incorporated by reference herein. However, other CVD methods can be used, including those known in the art, such as DC plasma, RF plasma, microwave plasma, or RF plasma arc-jet deposition of diamond from gaseous precursor materials.

It is generally desirable to deposit the CVD diamond onto the surface of the substrate, such that the CVD diamond layer exhibits enhanced crystal orientation in the crystallographic plane desired for the type of application to which the material will be put. The total thickness of the CVD diamond is generally between about 1 micron and about 2000 microns. For a cutting tool blank, the preferred diamond thickness is typically between about 100 microns and 1000 microns. For a wear component, the coating thickness is typically between about 1 micron and 100 microns. For a heat spreader, the diamond coating thickness is typically between about 20 microns and 500 microns.

EXAMPLES

The examples and comparative examples and the discussion that follow further illustrate the ability to prepare CVD diamond coatings on a composite substrate of ceramic material and a carbide-forming material for a variety of applications, including but not limited to: conditioning of conventional hard polyurethane CMP pads, fibrous CMP pads and fixed abrasive CMP pads; cutting tools; wear components; and heat spreaders. The comparative examples and examples are for illustrative purposes and are not meant to limit the scope of the claims in any way.

Example 1

A two (2) inch diameter silicon substrate having a thickness of 0.04 inch (~1 mm) was placed flat on a support fixture of an HFCVD reactor of the type described and claimed in the above-referenced Garg, et al., U.S. Pat. No. 5,186,973, as modified in the disclosure of U.S. Pat. Nos. 5,833,753 and 5,997,650, the entire contents of which are incorporated herein by reference. A monolayer of synthetic diamond grit having an average particle diameter of about 10 microns was uniformly distributed over the entire exposed surface of the first side of the silicon substrate to achieve an average grit density of 800 grains or grit particles per $mm^2$ and a range from 700 to 900 grains per $mm^2$. The grit from a container was uniformly distributed by using an air dispersion technique in which the grit was dropped at a controlled rate from a fixed height, above the wafer. A moving air current was used to disperse the grit in a lateral direction across the substrate.

The substrate was then placed in the CVD diamond deposition reactor. The reactor was closed and 15.95 kW (145 volts and 110 amps) were supplied to heat the filament to about 2000° C. A mixture of 72 sccm (standard cubic centimeters per minute) of methane in 3.0 slpm (standard liters per minute) of hydrogen was fed into the reactor for a period of 1 hours and 30 minutes at a pressure of 30 Torr to deposit about 1-2 microns of polycrystalline diamond onto the exposed surface of the diamond grit and the silicon substrate. The power was increased to 21.24 kW (177 volts and 120 amps) at a pressure of 25 Torr for an additional 29 hours and 30 minutes. The filament power was turned off and the coated substrate was cooled to room temperature under flowing hydrogen gas. A total of 8-12 microns of coherent polycrystalline diamond was deposited onto the previously deposited CVD diamond layer.

The second side of the disk from the latter step was bonded to a backing layer as illustrated in FIG. 3. The resulting conditioning head 34 was mounted on a conditioning arm and tested to determine its effectiveness compared with the standard conditioning head. The results unexpectedly indicated that the non-woven fiber, polyurethane impregnated polishing pad was not damaged during conditioning and the conditioner effectively conditioned the pad with acceptable wear rate of the pad.

Example 2

A 2" diameter by 0.135" thick round substrate of PUREBIDE R2000 reaction-bonded silicon carbide material which was surface-finished by through feed grinding was seeded with 1-2 micron diamond by mechanically rubbing the surface. The excess diamond was then removed from the surface. Diamond grit (10 micron size) was then dispersed on the surface of the substrate with a density of approximately 420 particles per $mm^2$. The sample was then placed in CVD deposition reactor and a layer of CVD diamond about 8 microns thick was deposited on the surface by the process outlined in Example #1. The sample was then examined and found to have a uniform adherent diamond coating. The bow of the coated substrate was found to be approximately 5+/−2 microns across the 2-inch diameter substrate. This value was, within measurement error, the same as the bow of the substrate prior to diamond coating. The 10 micron diamond crystals were strongly adhered to the surface. The sample was then hand rubbed on a polyurethane CMP polishing pad and reexamined. No indications of grit pull out were found. The resulting conditioning head 34 also was successful in conditioning a non-woven fiber, polyurethane impregnated polishing pad. In addition, this material possesses unexpectedly superior resistance to bowing as compared to the diamond-coated silicon product described in Example 1.

Example 3

A 2" diameter by 0.135" thick round substrate of PUREBIDE R2000 material with a lapped surface finish was seeded with 1-2 micron diamond by mechanically rubbing the surface. The excess diamond was then removed from the surface. Diamond grit (75 micron size) was then dispersed on the surface of the substrate with a density of 10 particles per $mm^2$. The sample was then placed in CVD deposition reactor and a CVD diamond layer about 15 microns thick was deposited on the surface by the process outlined in Example #1. The sample was then examined and found to have a uniform adherent diamond coating. The 75 micron diamond crystals were strongly adhered to the surface. The sample was then hand rubbed on a polyurethane CMP polishing pad and reexamined. No indications of grit pullout were found.

Comparative Example 1

A prior art conditioning disk commercially available as Diabond® CMP23550 from Morgan Advanced Ceramics, Inc., Diamonex Products was mounted on a conditioning arm and tested to determine the standard removal rate and polishing pad wear rate. The disk had a diameter of two inches and contained approximately 25,000 diamond particles having an average size of 35 microns bonded by 8 to 10 microns of CVD diamond. This standard conditioning disk damaged non-woven fiber, polyurethane impregnated polishing pad by tearing the fibers within the pad during an oxide polishing process, thus rendering the pad useless. This conditioning disk was therefore considered too aggressive for this type of pad.

Comparative Example 2

A prior art conditioning disk commercially available as Diabond® CMP225100 was mounted on a conditioning arm and tested to determine the standard removal rate and polishing pad wear rate. The disk had a diameter of two inches and contained approximately 50,000 diamond particles having an average size of 25 microns bonded by 8 to 10 microns of CVD diamond. This standard conditioning disk also damaged the non-woven fiber, polyurethane impregnated polishing pad by tearing the fibers within the pad during an oxide polishing process, again rendering the pad useless. This conditioning disk, like that of Comparative Example 1 was too aggressive for this type of pad.

Example 4

A 2" diameter by 0.135" thick round substrate of PUREBIDE R2000 material with a lapped surface finish was seeded with 1-2 micron diamond by mechanically rubbing the surface. The excess diamond was then removed from the surface. The sample was then placed in CVD deposition reactor and a layer of CVD diamond about 10 microns thick was deposited on the surface by the process outlined in Example #1. The sample was then examined and found to have a uniform adherent diamond coating. The sample was then hand rubbed on a polyurethane CMP polishing pad and reexamined. The diamond surface was intact. The conditioning head 34 was then used on an Applied Materials Mirra CMP System to successfully condition a fixed abrasive CMP pad.

Example 5

2" diameter by 0.135" thick round CMP pad conditioning disks for fixed abrasive CMP pads were fabricated from three PUREBIDE R2000 reaction-bonded SiC substrates, each having its surface finished by a different technique. The first substrate was finished by through feed grinding, the second substrate was finished by Blanchard grinding, and the third substrate was finished by lapping. The surface roughness of each substrate was measured before and after the surface finishing procedure. The second sample was less rough than the first, and the third sample was less rough than the second. Each of the substrates was then coated with CVD diamond to the same thickness in the same reactor at the same time and under the same conditions. Surface roughness was then measured and compared to the original roughness and to each other. In each case, the substrate with the higher original roughness also contained the higher after-coating roughness. The effect of initial surface roughness on final roughness for the fixed abrasive CMP conditioning disks is graphically illustrated in FIG. 17.

As indicated above, it has been found that the use of a composite substrate incorporating silicon carbide and silicon, such as reaction-bonded silicon carbide, as a CMP conditioning head substrate provides increased dimensional stability in that the resulting CVD diamond-coated composite materials resist "bowing", i.e., they remain flat when in use, providing a flatter profile on the conditioned polishing pads. This is illustrated by the example below, wherein several different conditioning heads were analyzed for bow and compared to that obtained with silicon substrates.

Example 6

A series of CMP polishing pad conditioners were produced using PUREBIDE R2000 substrates of thickness 0.135", and silicon substrates of thickness 0.40". The substrates were coated with CVD diamond coatings of various thicknesses. These coatings included a CVD diamond coating deposited onto a substrate without prior distribution of diamond grit, a CVD diamond coating over diamond grit of 50 microns average particle size, and a CVD diamond coating over diamond grit of 75 microns average particle size. The bow of the composite diamond-coated substrates was measured by using a Tencor P10 surface profiler over a 48 mm cord. The results obtained are presented in FIG. 18. FIG. 18A shows aggregate results for all of the materials tested. FIG. 18B presents the results in FIG. 18A, broken down by the type of coating.

In FIG. 18A, the open triangles represent data obtained from numerous CMP pad conditioners manufactured with a silicon substrate. The line labeled "Power (Silicon)" is a mathematical fit to the data points obtained with the silicon substrates showing the relationship of increasing bow as a function of CVD diamond coating thickness. The solid squares represent data obtained from CMP pad conditioners made with PUREBIDE R2000 substrates, and the line labeled "Linear (PUREBIDE R2000)" is a mathematical fit to those data points indicating virtually no change in bow as a function of diamond coating thickness.

In FIG. 18B, the open squares represent data obtained from gritless (i.e. no large diamond grains applied to the substrate prior to the CVD diamond coating) CMP pad conditioners manufactured with a silicon substrate; the line labeled "Power (Gritless/Si)" is a mathematical fit to those data points. The solid squares represent data obtained from gritless CMP pad conditioners manufactured with a PUREBIDE R2000 RBSiC substrate; the line labeled "Power (Gritless/RBSiC)" is a mathematical fit to those data points. The open diamond shapes represent data obtained from conditioners made with a silicon substrate and 50-micron grit applied to the substrate prior to the CVD diamond coating; the dashed line labeled "Power (50 micron Grit/Si)" is a mathematical fit to those data points. The solid diamond shapes represent data obtained from conditioners made with a PUREBIDE R2000 RBSiC substrate and 50-micron grit applied to the substrate prior to the CVD diamond coating; the thick dashed line labeled "Linear (50 micron Grit/RBSiC)" is a mathematical fit to those data points. The open triangle shapes represent data obtained from conditioners made with a silicon substrate and 75-micron grit applied to the substrate prior to the CVD diamond coating; the dotted line labeled "Power (75 micron Grit/Si)" is a mathematical fit to those data points. The solid triangle shapes represent data obtained from conditioners made with a PUREBIDE R2000 RBSiC substrate and 75-micron grit applied to the substrate prior to the CVD diamond coating; the thick dotted line labeled "Linear (75 micron Grit/RBSiC)" is a mathematical fit to those data points.

Both FIGS. 18A and 18B show that the amount of bow for the composite silicon carbide-silicon substrates is substantially lower than that of silicon substrates for diamond coating thickness above about 10 microns. Also, the amount of bow is strongly dependent on the diamond coating thickness for silicon substrates, whereas the thickness dependence is significantly less pronounced for the composite silicon carbide-silicon substrates. This shows that the composite silicon carbide substrates of the present invention are able to maintain dimensional stability at relatively high CVD diamond coating thickness, thereby providing superior CMP conditioning heads, wear parts, heat spreaders and other products.

Example 7

A 2" diameter by 0.135" thick round substrate of PUREBIDE R2000 material was prepared into a cutting tool blank by seeding with 1-2 micron diamond by mechanically rubbing the surface. The excess diamond was then removed from the surface. The sample was then placed in CVD deposition reactor and a layer of CVD diamond about 200 microns thick was deposited on the surface by the process outlined in Example #1. The sample was then examined and found to have a uniform adherent diamond coating. The sample was then lapped flat by diamond lapping the CVD diamond surface. The CVD diamond surface was then polished to a mirror finish obtaining a surface roughness Ra of approximately 0.02 micron.

Example 8

A heat spreader may be manufactured by deposition of between about 10 microns and about 500 microns of CVD diamond onto a 1" diameter reaction-bonded silicon carbide-silicon ceramic substrate. The resulting blank is then be lapped on the uncoated ceramic side to obtain the required total thickness. Further, the surface of the CVD diamond may be polished to a matte finish, e.g. less than 0.1 micron Ra, or a mirror finish, e.g. less than 0.03 micron Ra. Then, the CVD diamond surface and the back-side ceramic surfaces may be metallized using Ti/Pt/Au thin film metallization processes. The blank may then be cut into the required size by use of laser or mechanical sawing processes.

Example 9

A wear test component was prepared by the deposition of a 3-5 micron thick layer of CVD diamond by hot-filament CVD onto a reaction-bonded silicon carbide-silicon ceramic substrate. The surface of the ceramic substrate was diamond machined to a near mirror finish prior to deposition of the diamond layer. The nucleation and adhesion of the CVD diamond coating was found to be very good.

In an extension of this example, the same process is used to deposit a CVD diamond coating of between 0.1 micron and 50 microns thickness onto the polished sealing surfaces of a Reaction-bonded silicon carbide-silicon ceramic pump seal ring. After deposition, the CVD diamond surface is then polished to a near mirror finish, similar to original substrate surface finish, using any of a variety of mechanical or chemical polishing techniques. Alternatively, the surface of the RBSiC seal ring is not polished prior to the deposition of the CVD diamond layer, and the diamond layer is then polished after the deposition process has been completed.

What is claimed is:

1. A polishing pad conditioning head, comprising:
    a chemical vapor deposited diamond composite, comprising:
    (a) a substrate having a surface and a substrate surface bow, said substrate surface bow having a measured degree of bow, and comprising:
        (1) a first phase comprising at least one ceramic material; and
        (2) a second phase comprising at least one carbide-forming material; and
    (b) a chemical vapor deposited diamond coating disposed on at least a portion of a surface of the substrate, said coating disposed to achieve a coated surface on the substrate surface, said coated surface having a measured degree of coated surface bow, said measured degree of coated surface bow being substantially the same as the measured degree of substrate surface bow;
    whereby the polishing pad conditioning head is resistant to bowing and has a surface roughness suitable for conditioning a polishing pad.

2. The polishing pad conditioning head of claim 1, further comprising:
    a first layer of diamond grit having an average grain size in the range of about 1 micron to about 15 microns and substantially uniformly distributed with respect to an exposed surface of the substrate; and
    wherein the layer of chemical vapor deposited diamond disposed on the diamond grit-covered substrate,
    whereby the layer of chemical vapor deposited diamond at least partially encases and bonds the diamond grit to the substrate.

3. The polishing pad conditioning head of claim 2 wherein said grit is substantially uniformly distributed with respect to the surface of said substrate at a density between about 100 to about 50000 grains per mm².

4. The polishing pad conditioning head of claim 1 wherein the average grain size of the diamond grit is in the range of about 4 microns to about 10 microns.

5. The polishing pad conditioning head of claim 4 wherein said grit is substantially uniformly distributed on the surface of said substrate at a density of about 400 to about 2000 grains per mm².

6. The polishing pad conditioning head of claim 1, further comprising a layer of diamond grit having an average diameter less than 1 micron and that is substantially uniformly distributed with respect to said first layer and with respect to remaining exposed surface of the substrate and beneath said layer of chemical vapor deposited diamond.

7. The polishing pad conditioning head of claim 1, further comprising a backing layer bonded to said conditioning head.

8. The polishing pad conditioning head of claim 1 wherein said diamond grit has been distributed over the exposed surface of said substrate by an air dispersion process, comprising dropping the grit at a controlled rate from a fixed height above said exposed surface into a moving air current thereby dispersing the diamond grit in a lateral direction across said exposed surface while moving said source in a direction substantially orthogonal to the direction of the air current.

9. The polishing pad conditioning head of claim 1, wherein the ceramic material comprises silicon carbide and the carbide-forming material comprises silicon.

10. The polishing pad conditioning head of claim 1, wherein diamond layer is bonded directly to the substrate, without encased or bonded particles of grit.

11. The polishing pad conditioning head of claim 1, further comprising:
    a first layer of diamond grit having an average grain size in the range of about 15 microns to about 150 microns and substantially uniformly distributed with respect to an exposed surface of the substrate; and
    wherein the layer of chemical vapor deposited diamond disposed on the diamond grit-covered substrate,
    whereby the layer of chemical vapor deposited diamond at least partially encases and bonds the diamond grit to the substrate.

12. The polishing pad conditioning head of claim 11, wherein the diamond grit has an average grain size of about 75 microns.

13. The polishing pad conditioning head of claim 1, wherein the polishing pad to be conditioned is suitable for chemical mechanical planarization (CMP).

14. The polishing pad conditioning head of claim 13, wherein the polishing pad to be conditioned is suitable for chemical mechanical planarization (CMP) of components selected from the group consisting of: semiconductor wafers, dielectric wafers, and metallic wafers.

15. The polishing pad conditioning head of claim 1, wherein the polishing pad to be conditioned is suitable for polishing, or planarizing, or both, of wafers or disks used in computer hard disk drives.

16. The polishing pad conditioning head of claim 1, wherein the bow of the coated substrate is about 3 to about 7 microns per 2 inches of substrate diameter.

17. The polishing pad conditioning head of claim 1, wherein the bow of the coated substrate is not substantially greater than that of the uncoated substrate.

18. A polishing pad conditioning head, comprising:
    (a) a substrate having a surface having a measured degree of substrate surface bow, and comprising:

(1) a first phase comprising at least one ceramic material; and
(2) a second phase comprising at least one carbide-forming material, and having a first side and a second side;
(b) a layer of diamond grit having an average grain size in the range of about 1 micron to about 150 microns substantially uniformly distributed with respect to said first and second sides; and
(c) a layer of chemical vapor deposited diamond deposited on the grit-covered first and second sides, whereby the layer of chemical vapor deposited diamond encases and bonds said diamond grit to said sides, said layer of chemical vapor deposited diamond deposited to achieve a coated surface on the substrate and diamond grit, said coated surface having a measured degree of coated surface bow, said measured degree of coated surface bow being substantially the same as the substrate surface measured degree of bow.

* * * * *